(12) United States Patent
Yu et al.

(10) Patent No.: US 12,382,718 B2
(45) Date of Patent: Aug. 5, 2025

(54) SEMICONDUCTOR DEVICE

(71) Applicant: Samsung Electronics Co., Ltd., Suwon-si (KR)

(72) Inventors: Hyun-Yong Yu, Seoul (KR); Seung Geun Jung, Seoul (KR)

(73) Assignees: Samsung Electronics Co., Ltd., Gyeonggi-do (KR); KOREA UNIVERSITY Research and Business Foundation, Seoul (KR)

( * ) Notice: Subject to any disclaimer, the term of this patent is extended or adjusted under 35 U.S.C. 154(b) by 391 days.

(21) Appl. No.: 17/956,191

(22) Filed: Sep. 29, 2022

(65) Prior Publication Data

US 2023/0299086 A1    Sep. 21, 2023

(30) Foreign Application Priority Data

Mar. 18, 2022   (KR) ........................ 10-2022-0034170

(51) Int. Cl.
*H01L 27/092*   (2006.01)
*H01L 21/02*    (2006.01)
(Continued)

(52) U.S. Cl.
CPC ..... *H10D 84/856* (2025.01); *H01L 21/02603* (2013.01); *H10D 30/014* (2025.01);
(Continued)

(58) Field of Classification Search
CPC .. H10D 84/856; H10D 30/014; H10D 30/031; H10D 30/43; H10D 30/6735; H10D 62/121; H10D 64/017; H10D 64/018; H10D 84/0167; H10D 84/017; H10D 84/038; H10D 88/01; H10D 30/797; H10D 30/6757; H10D 64/685; H10D 64/689;
(Continued)

(56) References Cited

U.S. PATENT DOCUMENTS 7,736,966 B2   6/2010   Dyer et al.
8,101,473 B2   1/2012   Cho et al.
(Continued)

FOREIGN PATENT DOCUMENTS

KR   2020/0085914 A   7/2020

*Primary Examiner* — Tong-Ho Kim
(74) *Attorney, Agent, or Firm* — HARNESS, DICKEY & PIERCE, PLC.

(57) ABSTRACT

A semiconductor device may include an active pattern on a substrate, a lower channel pattern on the active pattern and including first and second lower semiconductor patterns, an upper channel pattern on the lower channel pattern and including first and second upper semiconductor patterns, a pair of lower source/drain patterns on opposite sides of the lower channel pattern and a pair of upper source/drain patterns on opposite sides of the upper channel pattern, and a gate electrode surrounding the lower and upper channel patterns. The gate electrode may include a first upper portion between the first and second upper semiconductor patterns, and a first lower portion between the first and second lower semiconductor patterns. Each semiconductor pattern may include a first recess part having a first recess region on a top surface thereof, and a first protrusion part protruding from a bottom surface of the first recess part.

20 Claims, 26 Drawing Sheets

(51) Int. Cl.
*H01L 21/822* (2006.01)
*H01L 21/8238* (2006.01)
*H01L 29/06* (2006.01)
*H01L 29/423* (2006.01)
*H01L 29/66* (2006.01)
*H01L 29/775* (2006.01)
*H10D 30/01* (2025.01)
*H10D 30/43* (2025.01)
*H10D 30/67* (2025.01)
*H10D 62/10* (2025.01)
*H10D 64/01* (2025.01)
*H10D 84/01* (2025.01)
*H10D 84/03* (2025.01)
*H10D 84/85* (2025.01)
*H10D 88/00* (2025.01)

(52) U.S. Cl.
CPC .......... H10D 30/031 (2025.01); H10D 30/43 (2025.01); H10D 30/6735 (2025.01); H10D 62/121 (2025.01); H10D 64/017 (2025.01); H10D 64/018 (2025.01); H10D 84/0167 (2025.01); H10D 84/017 (2025.01); H10D 84/038 (2025.01); H10D 88/01 (2025.01)

(58) Field of Classification Search
CPC .. H10D 64/691; H10D 64/518; H10D 62/822; H10D 62/832; H10D 64/256; H10D 84/85; H10D 88/00; H10D 62/124; H10D 62/149; H01L 21/02603; B82Y 10/00
USPC ......................................................... 257/351
See application file for complete search history.

(56) References Cited

U.S. PATENT DOCUMENTS

| | | |
|---|---|---|
| 8,835,191 B2 | 9/2014 | Bryant et al. |
| 10,685,887 B2 | 6/2020 | Smith et al. |
| 10,978,593 B2 | 4/2021 | Leobandung |
| 11,152,510 B2 | 10/2021 | Zhang et al. |
| 2009/0146194 A1 | 6/2009 | Moselund et al. |
| 2016/0293706 A1 | 10/2016 | Cai et al. |
| 2021/0057535 A1 | 2/2021 | Chiang et al. |
| 2023/0052477 A1* | 2/2023 | Ha .................. H10D 62/151 |

* cited by examiner

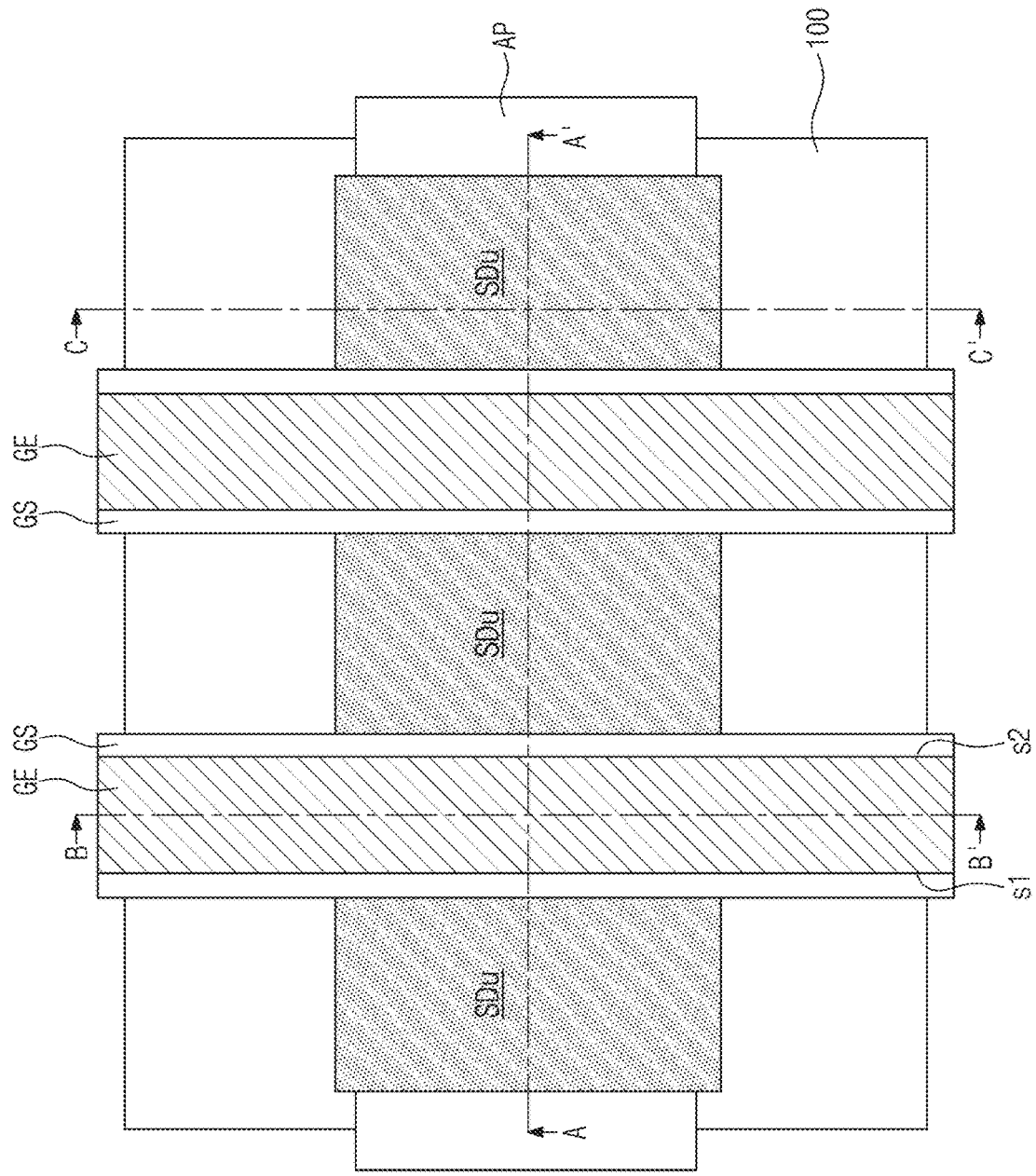

SEMICONDUCTOR DEVICE

CROSS-REFERENCE TO RELATED APPLICATION

This U.S. nonprovisional application claims priority under 35 U.S.C § 119 to Korean Patent Application No. 10-2022-0034170, filed on Mar. 18, 2022 in the Korean Intellectual Property Office, the disclosure of which is hereby incorporated by reference in its entirety.

BACKGROUND

The present disclosure relates to a semiconductor device, and more particularly, to a semiconductor device including a field effect transistor.

A semiconductor device may include an integrated circuit with metal oxide semiconductor field effect transistors (MOSFETs). As sizes and design rules of the semiconductor device are gradually decreased, sizes of the MOSFETs also increasingly may be scaled down. The scale down of MOSFETs may deteriorate operating characteristics of the semiconductor device. Accordingly, various studies have been conducted to develop methods of fabricating semiconductor devices having superior performance while overcoming issues associated with high integration of the semiconductor devices.

SUMMARY

Some embodiments of inventive concepts provide a semiconductor device with increased electrical properties.

According to some embodiments of inventive concepts, a semiconductor device may include an active pattern on a substrate; a lower channel pattern on the active pattern, the lower channel pattern including a first lower semiconductor pattern and a second lower semiconductor pattern that are stacked on each other and spaced apart from each other; an upper channel pattern on the lower channel pattern, the upper channel pattern including a first upper semiconductor pattern and a second upper semiconductor pattern that are stacked on each other and spaced apart from each other; a pair of lower source/drain patterns on opposite sides of the lower channel pattern; a pair of upper source/drain patterns on opposite sides of the upper channel pattern; and a gate electrode surrounding the lower channel pattern and the upper channel pattern while extending across the active pattern. The gate electrode may include a first upper portion and a first lower portion, the first upper portion being between the first upper semiconductor pattern and the second upper semiconductor pattern, and the first lower portion being between the first lower semiconductor pattern and the second lower semiconductor pattern. The first upper semiconductor pattern, the second upper semiconductor pattern, the first lower semiconductor pattern, and the second lower semiconductor pattern each may include a first recess part and a first protrusion part. The first recess part may have a first recess region on a top surface of the first recess part, and the first protrusion part may protrude from a bottom surface of the first recess part.

According to some embodiments of inventive concepts, a semiconductor device may include an active pattern extending in a first direction on a substrate; a lower channel pattern on the active pattern, the lower channel pattern including a first lower semiconductor pattern, a second lower semiconductor pattern, and a third lower semiconductor pattern that are sequentially stacked on each other and spaced apart from each other; an upper channel pattern on the lower channel pattern, the upper channel pattern including a first upper semiconductor pattern, a second upper semiconductor pattern, and a third upper semiconductor pattern that are sequentially stacked on each other and spaced apart from each other; a pair of lower source/drain patterns on opposite sides of the lower channel pattern, the pair of lower source/drain pattern having bottom surfaces at a level lower than a level of an uppermost surface of the active pattern; a first interlayer dielectric layer on the pair of lower source/drain patterns; a pair of upper source/drain patterns on the first interlayer dielectric layer and on opposite sides of the upper channel pattern; a second interlayer dielectric layer on the pair of upper source/drain patterns; a gate electrode extending in second direction across the active pattern, the second direction intersecting the first direction and the gate electrode surrounding the lower channel pattern and the upper channel pattern; a gate spacer on a sidewall of the gate electrode; and a gate capping pattern on a top surface of the gate electrode. The gate electrode may include a first lower portion on a bottom surface of the first lower semiconductor pattern, a second lower portion between the first lower semiconductor pattern and the second lower semiconductor pattern, a third lower portion between the second lower semiconductor pattern and the third lower semiconductor pattern, a first upper portion between the first lower semiconductor pattern and the first upper semiconductor pattern, a second upper portion between the first upper semiconductor pattern and the second upper semiconductor pattern, a third upper portion between the second upper semiconductor pattern and the third upper semiconductor pattern, and a fourth upper portion on a top surface of the third upper semiconductor pattern. The first upper semiconductor pattern, the second upper semiconductor pattern, the third upper semiconductor pattern, the first lower semiconductor pattern, the second lower semiconductor pattern, and the third lower semiconductor pattern each may include a first recess part and a first protrusion part, the first recess part having a first recess region on a top surface of the first recess part, and the first protrusion part protruding from a bottom surface of the first recess part.

According to some embodiments of inventive concepts, a semiconductor device may include an active pattern extending in a first direction on a substrate; a lower channel pattern on the active pattern, the lower channel pattern including a first lower semiconductor pattern, a second lower semiconductor pattern, and a third lower semiconductor pattern that are sequentially stacked on each other and spaced apart from each other; an upper channel pattern on the lower channel pattern, the upper channel pattern including a first upper semiconductor pattern, a second upper semiconductor pattern, and a third upper semiconductor pattern that are sequentially stacked on each other and spaced apart from each other; a pair of lower source/drain patterns on opposite sides of the lower channel pattern, the pair of lower source/drain pattern having bottom surfaces at a level lower than a level of an uppermost surface of the active pattern; a first interlayer dielectric layer on the pair of lower source/drain patterns; a pair of upper source/drain patterns on the first interlayer dielectric layer and on opposite sides of the upper channel pattern; a second interlayer dielectric layer on the pair of upper source/drain patterns; a gate electrode extending in second direction across the active pattern, the second direction intersecting the first direction, the gate electrode surrounding the lower channel pattern and the upper channel pattern; a gate spacer on a sidewall of the gate electrode; and a gate capping pattern on a top surface of the gate electrode.

The gate electrode may include a first lower portion on a bottom surface of the first lower semiconductor pattern, a second lower portion between the first lower semiconductor pattern and the second lower semiconductor pattern, a third lower portion between the second lower semiconductor pattern and the third lower semiconductor pattern, a first upper portion between the first lower semiconductor pattern and the first upper semiconductor pattern, a second upper portion between the first upper semiconductor pattern and the second upper semiconductor pattern, a third upper portion between the second upper semiconductor pattern and the third upper semiconductor pattern, and a fourth upper portion on a top surface of the third upper semiconductor pattern. The first upper semiconductor pattern, the second upper semiconductor pattern, the third upper semiconductor pattern, the first lower semiconductor pattern, the second lower semiconductor pattern, and the third lower semiconductor pattern each may include a first recess part and a first protrusion part, the first recess part having a first recess region on a top surface of the first recess part, and the first protrusion part protruding from a bottom surface of the first recess part.

BRIEF DESCRIPTION OF THE DRAWINGS

FIG. 1 illustrates a plan view showing a semiconductor device according to some embodiments of inventive concepts.

DETAILED DESCRIPTION

Figure 2A:
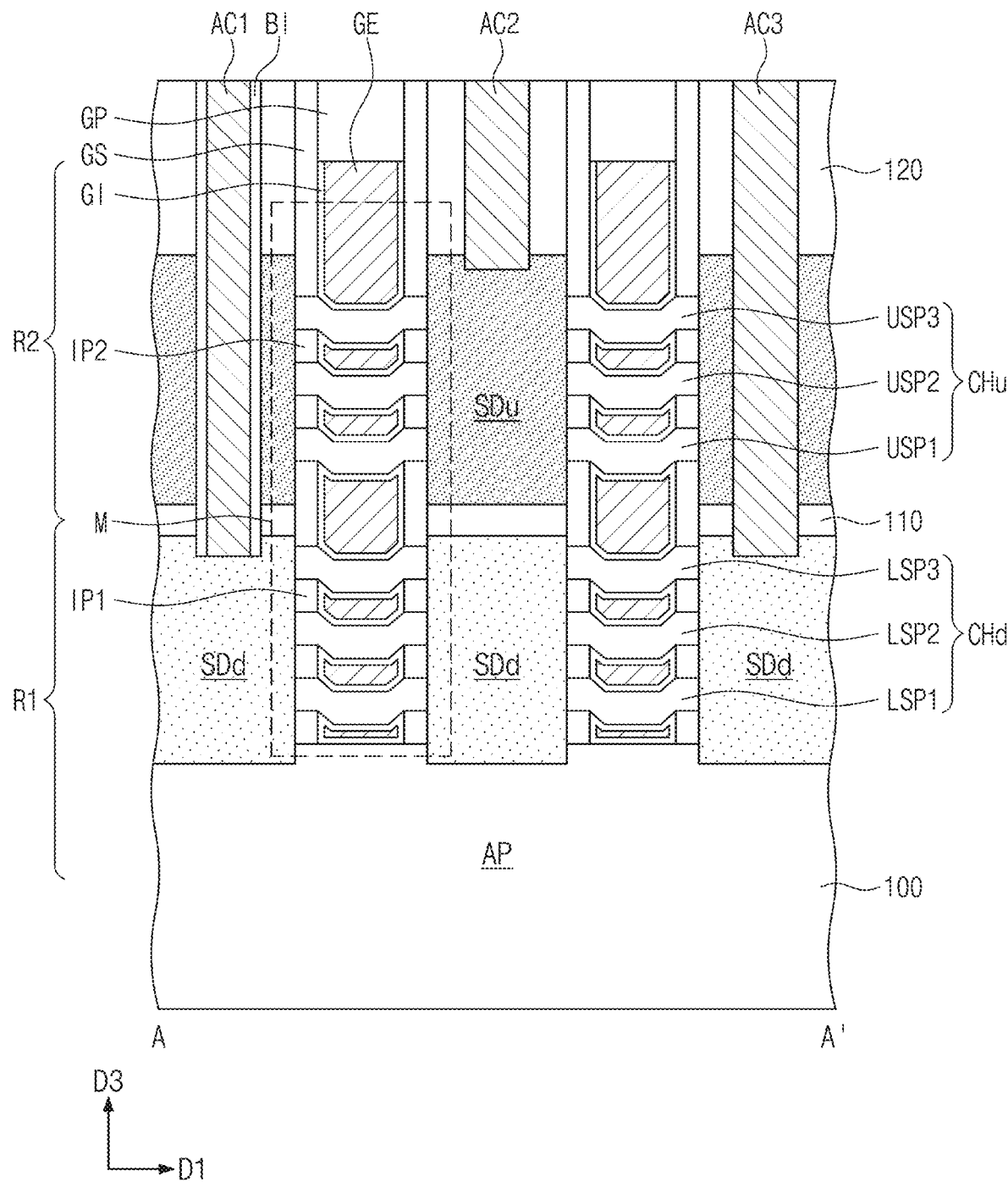
FIGS. 2A, 2B, and 2C illustrate cross-sectional views respectively taken along lines A-A', B-B', and C-C' of FIG. 1.
Figure 2B:
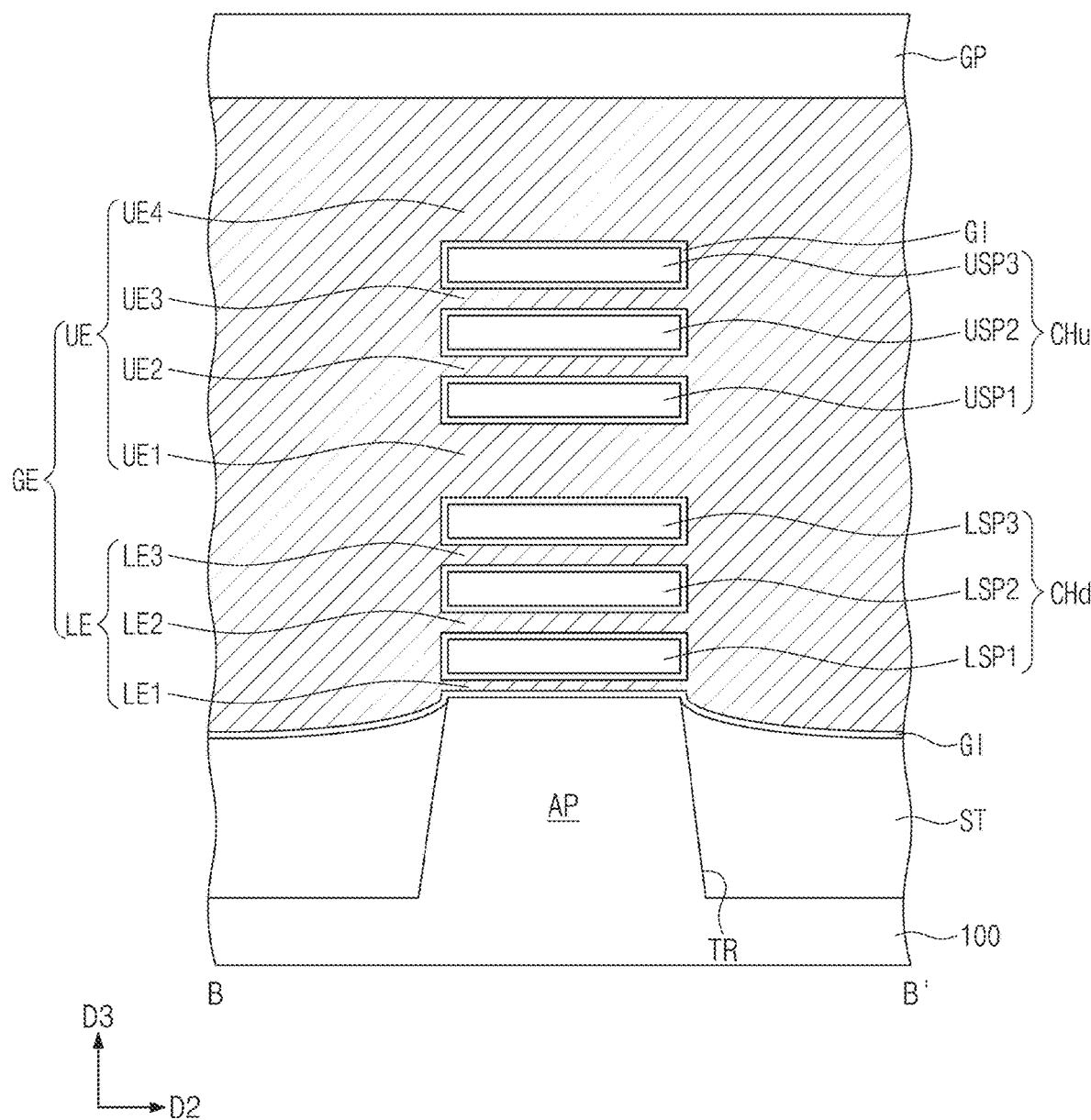
Figure 2C:
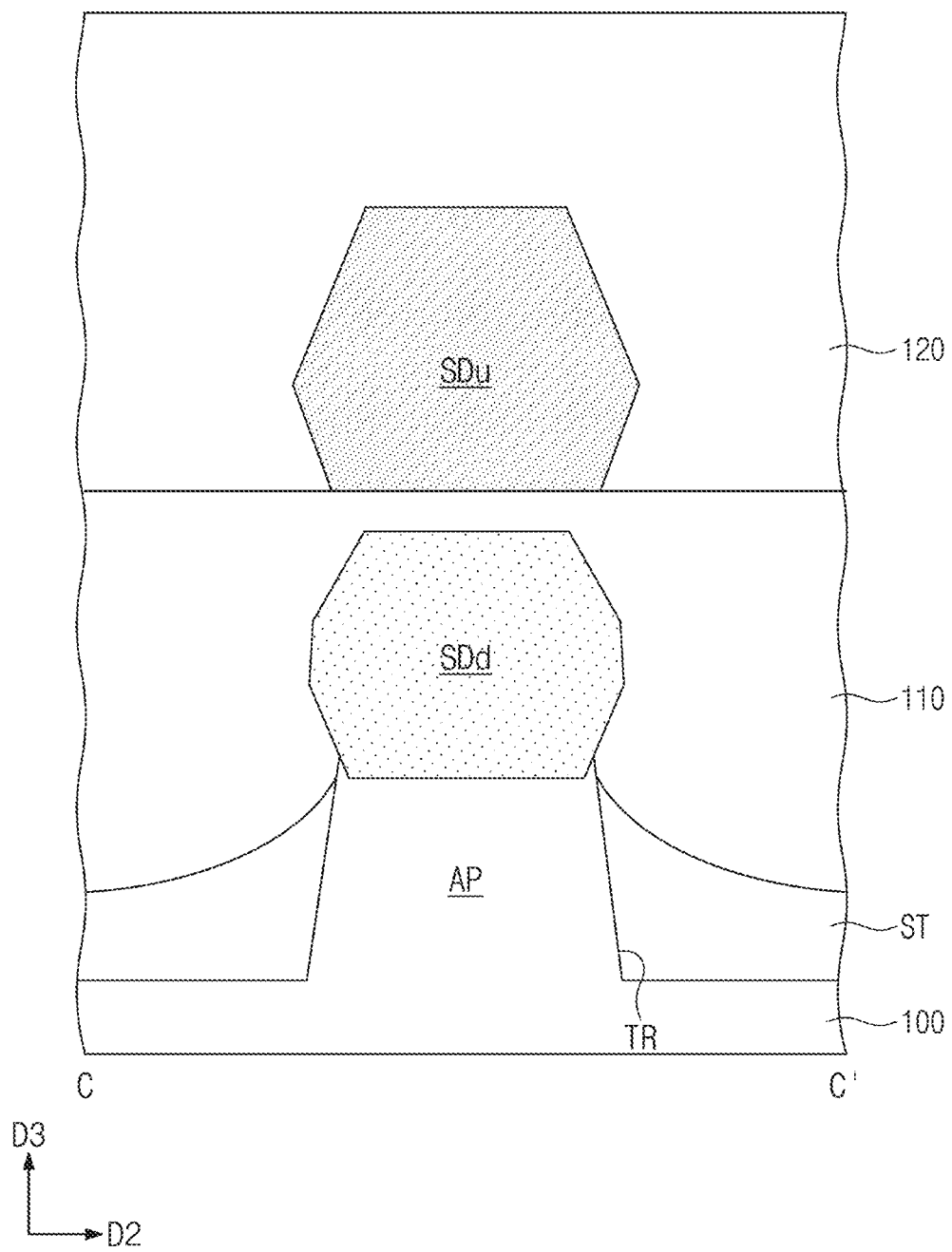
Figure 3:
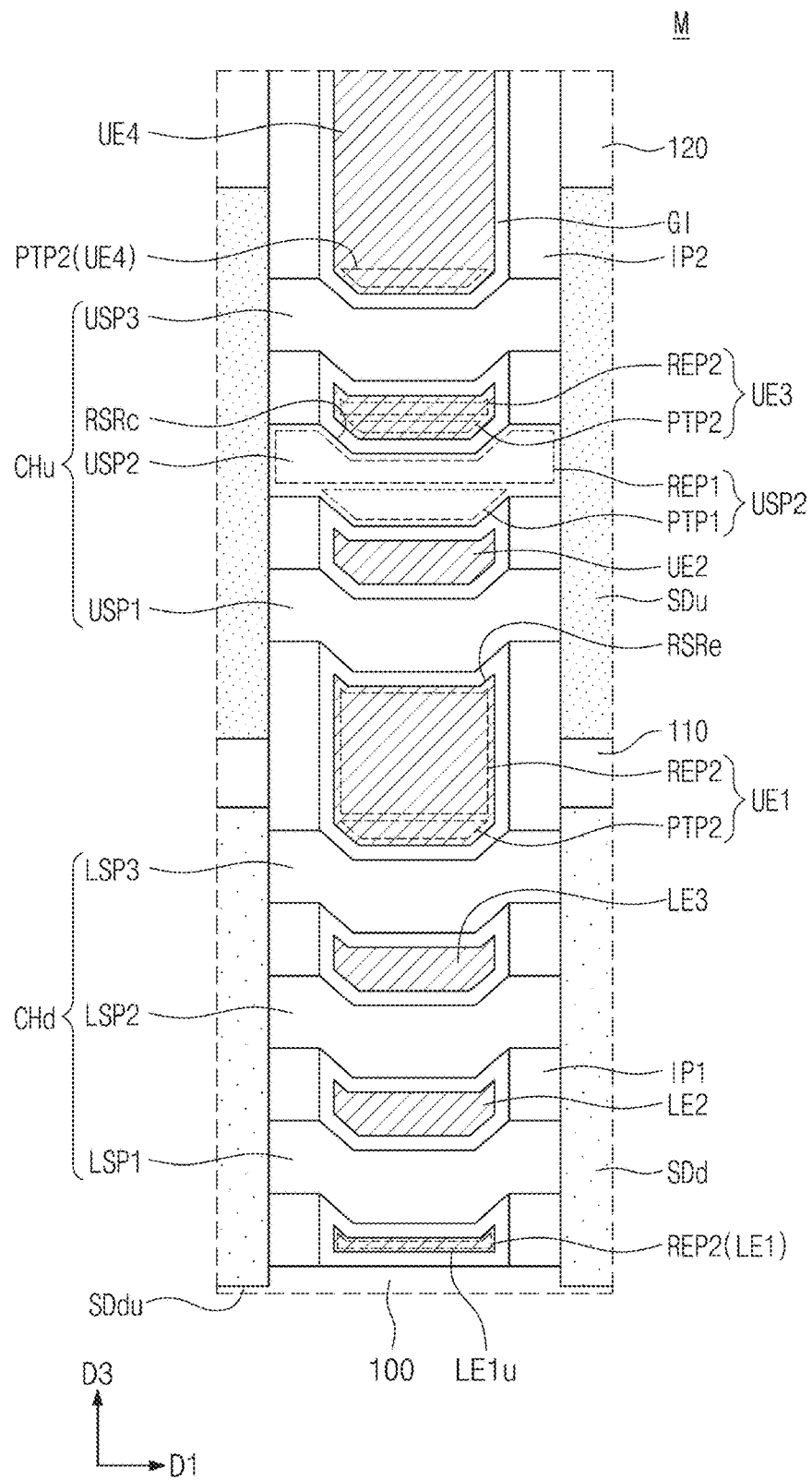
FIG. 3 illustrates an enlarged cross-sectional view showing section M of FIG. 2A.

FIG. 1 illustrates a plan view showing a semiconductor device according to some embodiments of inventive concepts. FIGS. 2A, 2B, and 2C illustrate cross-sectional views respectively taken along lines A-A', B-B', and C-C' of FIG. 1. FIG. 3 illustrates an enlarged cross-sectional view showing section M of FIG. 2A.

Referring to FIGS. 1 and 2A, a semiconductor device may be provided to include a first region R1 on a substrate 100 and a second region R2 on the first region RE The substrate 100 may be a compound semiconductor substrate or a semiconductor substrate including silicon, germanium, or silicon-germanium. The substrate 100 may be a semiconductor-on-insulator (SOI) substrate (e.g., silicon on insulator substrate).

Each of the first and second regions R1 and R2 may include one or more transistors. The first region R1 may include one of NMOS and PMOS transistors. The second region R2 may include another of NMOS and PMOS transistors. For example, the first region R1 may include an NMOS transistor, and the second region R2 may include a PMOS transistor.

According to an embodiment of inventive concepts, the first and second regions R1 and R2 may be a portion of a standard cell section that constitutes a logic device. The transistors in the first and second regions R1 and R2 may be logic transistors included in the standard cell.

According to an embodiment of inventive concepts, the first and second regions R1 and R2 may be a portion of a memory cell section including a plurality of transistors for storing data. For example, transistors of the first and second regions R1 and R2 may be memory transistors included in a static random access memory (SRAM) cell.

The transistors of the first region R1 may include lower source/drain patterns SDd and lower channel patterns CHd that connect the lower source/drain patterns SDd to each other. The transistors of the second region R2 may include upper source/drain patterns SDu and upper channel patterns CHu that connect the upper source/drain patterns SDu to each other. The transistors of the first and second regions R1 and R2 may be turned on or off in accordance with a switching signal applied to a gate electrode GE. Based on functions in the semiconductor device, the gate electrode GE may be shared or not shared by the transistors in the first and second regions R1 and R2. The lower source/drain patterns SDd may have a n-conductivity type. The upper source/drain patterns SDu may have a p-conductivity type. However, example embodiments are not limited thereto.

A pair of lower source/drain patterns SDd may be spaced apart from each other across one gate electrode GE. A pair of upper source/drain patterns SDu may be spaced apart from each other across one gate electrode GE. The lower channel pattern CHd may include a first lower semiconductor pattern LSP1, a second lower semiconductor pattern LSP2, and a third lower semiconductor pattern LSP3 that run across the one gate electrode GE and are connected to the pair of lower source/drain patterns SDd. The upper channel pattern CHu may include a first upper semiconductor pattern USP1, a second upper semiconductor pattern USP2, and a third upper semiconductor pattern USPS that run across the one gate electrode GE and are connected to the pair of upper source/drain patterns SDu.

Referring to FIGS. 1 and 2A to 2C, an active pattern AP may be provided on the substrate 100. The active pattern AP may extend in a first direction D1 parallel to a top or bottom surface of the substrate 100. The active pattern AP may be defined by a trench TR formed on an upper portion of the substrate 100. For example, the active pattern AP may be a portion of the substrate 100.

A device isolation layer ST may fill the trench TR. The device isolation layer ST may include silicon oxide. The device isolation layer ST may not cover an upper portion of the active pattern AP. The device isolation layer ST may cover sidewalls of the active pattern AP.

The lower source/drain patterns SDd may be provided on the active pattern AP. The lower source/drain patterns SDd may be arranged in the first direction D1. The lower source/drain patterns SDd may be spaced apart from each other in the first direction D1. The lower source/drain patterns SDd may be epitaxial patterns formed by a selective epitaxial growth process. The lower source/drain patterns SDd may include impurities having a first conductivity type (e.g., n-type). The lower source/drain patterns SDd may include a semiconductor element (e.g., Si) the same as that of the substrate 100.

The lower channel pattern CHd may be disposed between the lower source/drain patterns SDd. The lower channel pattern CHd may be connect to an adjacent pair of lower source/drains patterns SDd in the first direction D1. The lower channel pattern CHd may include the first to third lower semiconductor patterns LSP1 to LSP3 that are vertically stacked. The first to third lower semiconductor patterns LSP1 to LSP3 may be sequentially stacked while being spaced apart from each in a third direction D3. The first to third lower semiconductor patterns LSP1 to LSP3 may vertically overlap each other. Each of the first to third lower semiconductor patterns LSP1 to LSP3 may include silicon (Si), germanium (Ge), or silicon-germanium (SiGe). Each of the first to third lower semiconductor patterns LSP1 to LSP3 may include, for example, crystalline silicon.

A first interlayer dielectric layer 110 may be provided on the substrate 100. The first interlayer dielectric layer 110 may cover the lower source/drain patterns SDd. The first interlayer dielectric layer 110 may have a top surface at a higher level than that of top surfaces of the lower source/drain patterns SDd. The first interlayer dielectric layer 110 may have a bottom surface in contact with the device isolation layer ST. The bottom surface of the first interlayer dielectric layer 110 may be located at a lower level than that of a top surface of the active pattern AP.

The upper source/drain patterns SDu may be provided on the top surfaces of the lower source/drain patterns SDd. The upper source/drain patterns SDu may vertically overlap the lower source/drain patterns SDd. The upper source/drain patterns SDu may be arranged in the first direction D1. The upper source/drain patterns SDu may be epitaxial patterns formed by a selective epitaxial growth process. The upper source/drain patterns SDu may include impurities having a second conductivity type (e.g., p-type). The upper source/drain patterns SDu may include a semiconductor element (e.g., SiGe) whose lattice constant is greater than that of a semiconductor element included in the substrate 100.

The upper channel pattern CHu may be disposed between the upper source/drain patterns SDu. The upper channel pattern CHu may be connected to an adjacent pair of upper source/drain patterns SDu in the first direction D1. The upper channel pattern CHu may include the first to third upper semiconductor patterns USP1 to USP3 that are vertically stacked. The first to third upper semiconductor patterns USP1 to USP3 may be sequentially stacked while being spaced apart from each other in the third direction D3. The first to third upper semiconductor patterns USP1 to USP3 may vertically overlap each other. Each of the first to third upper semiconductor patterns USP1 to USP3 may be interposed between a pair of upper source/drain patterns SDu and provided with compressive stress. The first to third upper semiconductor patterns USP1 to USP3 may include silicon (Si), germanium (Ge), or silicon-germanium (SiGe). Each of the first to third upper semiconductor patterns USP1 to USP3 may include crystalline silicon.

A second interlayer dielectric layer 120 may be provided on the first interlayer dielectric layer 110. The second interlayer dielectric layer 120 may cover the upper source/drain patterns SDu. The second interlayer dielectric layer 120 may cover lateral and top surfaces of the upper source/drain patterns SDu. The second interlayer dielectric layer 120 may not cover bottom surfaces of the upper source/drain patterns SDu.

A plurality of gate electrodes GE may be provided to extend in a second direction D2, while running across the active pattern AP. The gate electrodes GE may be arranged in the first direction D1. The gate electrode GE may extend between a pair of lower source/drain patterns SDd and between a pair of upper source/drain patterns SDu. The gate electrode GE may have opposite sidewalls s1 and s2 facing the pair of lower source/drain patterns SDd and the pair of upper source/drain patterns SDu. For example, the pair of lower source/drain patterns SDd may be provided on the opposite sidewalls s1 and s2 of the gate electrode GE. The pair of upper source/drain patterns SDu may be provided between the opposite sidewalls s1 and s2 of the gate electrode GE and spaced apart in the third direction D3 from the pair of lower source/drain patterns SDd.

The gate electrode GE may run across the lower and upper channel patterns CHd and CHu. The gate electrode GE may include a lower portion LE that surrounds at least a portion of the lower channel pattern CHd and an upper portion UE that surrounds at least a portion of the upper channel pattern CHu (see FIG. 2B). The transistor according to some embodiments may be a three-dimensional field effect transistor (e.g., MBCFET) in which the gate electrode GE three-dimensionally surrounds the lower channel pattern CHd and the upper channel pattern CHu. The lower portion LE of the gate electrode GE may switch lower transistors including the lower channel patterns CHd and the lower source/drain patterns SDd. The upper portion UE of the gate electrode GE may switch upper transistors including the upper channel patterns CHu and the upper source/drain patterns SDu. The lower and upper portions LE and UE of the gate electrode GE may be electrically connected to each other and controlled at the same time. The lower portion LE of the gate electrode GE may be positioned between neighboring first to third lower semiconductor patterns LSP1 to LSP3 and between the first lower semiconductor pattern LSP1 and the active pattern AP. The upper portion UE of the gate electrode GE may be positioned between neighboring first to third upper semiconductor patterns USP1 to USP3, between the first upper semiconductor pattern USP1 and the third lower semiconductor pattern LSP3, and on a top surface of the third upper semiconductor pattern USP3.

A plurality of gate spacers GS may be disposed on the opposite sidewalls s1 and s2 of the gate electrode GE. The gate spacers GS may extend in the second direction D2 along the gate electrode GE. The gate spacers GS may have their top surfaces at a higher level than that of a top surface of the gate electrode GE. The top surfaces of the gate spacers GS may be coplanar with that of the second interlayer dielectric layer 120. The gate spacers GS may include at least one selected from SiCN, SiCON, and SiN. Alternatively, the gate spacers GS may include a multi-layer formed of a least two selected from SiCN, SiCON, and SiN.

A gate capping pattern GP may be provided on the gate electrode GE. The gate capping pattern GP may extend in the second direction D2 along the gate electrode GE. The gate capping pattern GP may include at least selected from SiON, SiCN, SiCON, and SiN.

A gate dielectric layer GI may be interposed between the gate electrode GE and the lower channel pattern CHd and between the gate electrode GE and the upper channel pattern CHu. The gate dielectric layer GI may cover a top surface, a bottom surface, and sidewalls of each of the first to third lower semiconductor patterns LSP1 to LSP3 and of the first to third upper semiconductor patterns USP1 to USP3.

According to some embodiments, the gate dielectric layer GI may include one or more of a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. According to some embodiments, the semiconductor device of inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (HD), zirconium (Zr), and oxygen (0).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but inventive concepts are not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and adjacent to the lower and upper channel patterns CHd and CHu. The first metal pattern may include a work-function metal that controls a threshold voltage of a transistor. A thickness and composition of the first metal pattern may be adjusted to achieve a desired threshold voltage of a transistor. For example, the lower portion LE between neighboring first to third lower semiconductor patterns LSP1 to LSP3 and the upper portion UE between neighboring first to third upper semiconductor patterns USP1 to USP3 may be formed of the first metal pattern, or a work-function metal.

The first metal pattern may include metal nitride. For example, the first metal pattern may include nitrogen (N) and at least one metal, such as titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include a metal whose resistance is less than that of the first metal pattern. For example, the second metal pattern may include at least one metal, such as tungsten (W), aluminum (Al), titanium (Ti), and tantalum (Ta).

A plurality of lower inner spacers IP1 may be provided between the gate electrode GE and the lower source/drain patterns SDd. A plurality of upper inner spacers IP2 may be provided between the gate electrode GE and the upper source/drain patterns SDu. The lower inner spacers IP1 may be positioned between the top and bottom surfaces of each of neighboring first to third lower semiconductor patterns LSP1 to LSP3. The upper inner spacers IP2 may be positioned between the top and bottom surfaces of each of neighboring first to third upper semiconductor patterns USP1 to USP3.

According to some embodiments of inventive concepts, the semiconductor device may include first, second, and third active contacts AC1, AC2, and AC3 that are coupled to the lower source/drain patterns SDd and the upper source/drain patterns SDu.

The first active contact AC1 may be electrically connected to the lower source/drain pattern SDd. The first active contact AC1 may penetrate the first and second interlayer dielectric layers 110 and 120 and the upper source/drain pattern SDu, thereby being coupled to the lower source/drain pattern SDd. A barrier dielectric layer BI may be provided on a sidewall of the first active contact AC1. The barrier dielectric layer BI may electrically insulate the first active contact AC1 and the upper source/drain pattern SDu from each other. For example, the first active contact AC1 may extend into the lower source/drain pattern SDd. The first active contact AC1 may have a bottom surface lower than the top surface of the lower source/drain pattern SDd.

The second active contact AC2 may be electrically connected to the upper source/drain pattern SDu. The second active contact AC2 may penetrate the second interlayer dielectric layer 120.

The third active contact AC3 may be electrically connected to the lower source/drain pattern SDd and the upper source/drain pattern SDu that vertically overlap each other. The third active contact AC3 may penetrate the first and second interlayer dielectric layers 110 and 120 and the upper source/drain pattern SDu, thereby being coupled to the lower source/drain pattern SDd. The third active contact AC3 may have a sidewall with a portion in contact with the upper source/drain pattern SDu. The third active contact AC3 may extend into the lower source/drain pattern SDd. The third active contact AC3 may have a bottom surface lower than the top surface of the lower source/drain pattern SDd.

With reference to FIG. 3, the following will describe in detail the gate electrode GE, the lower channel pattern CHd, and the upper channel pattern CHu.

Referring to FIG. 3, the lower channel pattern CHd may include the first to third lower semiconductor patterns LSP1 to LSP3 that are vertically stacked. The upper channel pattern CHu may include the first to third upper semiconductor patterns USP1 to USP3 that are vertically stacked. The first to third lower semiconductor patterns LSP1 to LSP3 and the first to third upper semiconductor patterns USP1 to USP3 each may include their structures that are substantially the same as or similar to each other. The first to third lower semiconductor patterns LSP1 to LSP3 may be disposed along the third direction D3 at a regular interval. The first to third upper semiconductor patterns USP1 to USP3 may be disposed along the third direction D3 at a regular interval.

The following will describe in detail a structure of the second upper semiconductor pattern USP2 as a representative example, and the same may hold true for structures of the first to third lower semiconductor patterns LSP1 to LSP3 and the first to third upper semiconductor patterns USP1 to USP3.

The second upper semiconductor pattern USP2 may have a downwardly bent shape. The second upper semiconductor pattern USP2 may include a first protrusion part PTP1 and a first recess part REP1 on the first protrusion part PTP1. The first to third lower semiconductor patterns LSP1 to LSP3, the first upper semiconductor pattern USP1, and the third upper semiconductor pattern USP3 each may also include a first protrusion part PTP1 and a first recess part REP1. The first recess part REP1 of each of the first to third upper semiconductor patterns USP1 to USP3 may be in contact with the upper source/drain pattern SDu. The first recess part REP1 of each of the first to third lower semiconductor patterns LSP1 to LSP3 may be in contact with the lower source/drain pattern SDd.

The first recess part REP1 may include a first recess region RSRc on a top surface thereof. The first recess region RSRc may be an area that is recessed from the top surface of the first recess part REP1. The first recess region RSRc may have a width in the first direction D1 that decreases in a downward direction. For example, the width in the first direction D1 of the first recess region RSRc may decrease in a direction toward the substrate 100.

The first protrusion part PTP1 may protrude from a bottom surface of the first recess part REP1. The first protrusion part PTP1 may have a width in the first direction D1 that decreases in a downward direction. The first protrusion part PTP1 may have a trapezoidal shape. The width in the first direction D1 of the first protrusion part PTP1 may decrease in a direction toward the substrate 100. The width in the first direction D1 of the first protrusion part PTP1 may be less than a maximum width in the first direction D1 of the first recess part REP1. The first protrusion part PTP1 may have a sidewall spaced apart from the lower inner spacer IP1 or the upper inner spacer IP2.

The gate electrode GE may include first to fourth upper portions UE1 to UE4 and first to third lower portions LE1 to LE3. The first upper portion UE1 may be positioned between the first upper semiconductor pattern USP1 and the third lower semiconductor pattern LSP3. The second upper portion UE2 may be positioned between the first upper semiconductor pattern USP1 and the second upper semiconductor pattern USP2. The third upper portion UE3 may be positioned between the second upper semiconductor pattern USP2 and the third upper semiconductor pattern USP3. The fourth upper portion UE4 may be positioned on a top surface of the third upper semiconductor pattern USP3. The fourth upper portion UE4 may have a thickness greater than those of the second and third upper portions UE2 and UE3. For example, the first upper portion UE1 may have a thickness greater than those of the second and third upper portions UE2 and UE3. The fourth upper portion UE4 may have a thickness greater than those of the first to third upper portions UE1 to UE3 and those of the first to third lower portions LE1 to LE3.

The first lower portion LE1 may be positioned between a bottom surface of the first lower semiconductor pattern LSP1 and the top surface of the active pattern AP. The second lower portion LE2 may be positioned between the first lower semiconductor pattern LSP1 and the second lower semiconductor pattern LSP2. The third lower portion LE3 may be positioned between the second lower semiconductor pattern LSP2 and the third lower semiconductor pattern LSP3.

The following will describe in detail a structure of the third upper portion UE3 as a representative example, and the same may hold true for structures of the first upper portion UE1, the second upper portion UE2, the fourth upper portion UE4, and the first to third lower portions LE1 to LE3.

The third upper portion UE3 may have a downwardly bent shape. The third upper portion UE3 may include a second protrusion part PTP2 and a second recess part REP2 on the second protrusion part PTP2. The second lower portion LE2, the third lower portion LE3, the first upper portion UE1, and the second upper portion UE2 each may include a second protrusion part PTP2 and a second recess part REP2.

The second recess part REP2 may include a second recess region RSRe on a top surface thereof. The second recess region RSRe may be an area that is recessed from the top surface of the second recess part REP2. The second recess region RSRe may have a width in the first direction D1 that decreases in a downward direction. For example, the width in the first direction D1 of the second recess region RSRe may decrease in a direction toward the substrate 100.

The second protrusion part PTP2 may protrude from a bottom surface of the second recess part REP2. The width in the first direction D1 of the second protrusion part PTP2 may decrease in a downward direction. The width in the first direction D1 of the second protrusion part PTP2 may decrease in a direction toward the substrate 100. The second protrusion part PTP2 may have a trapezoidal shape.

The first lower portion LE1 may include the second recess part REP2, and may not include the second protrusion part PTP2. For example, the first lower portion LE1 may have a flat bottom surface LE1u. The fourth upper portion UE4 may include the second protrusion part PTP2, and may not include the second recess part REP2. The lower source/drain pattern SDd may have a bottom surface SDdu located at a lower level than that of an uppermost surface of the substrate 100 (or the active pattern AP).

The first protrusion part PTP1 of the first lower semiconductor pattern LSP1 may protrude toward the second recess region RSRe of the first lower portion LE1. The first protrusion part PTP1 of the first lower semiconductor pattern LSP1 may have a shape that corresponds to that of the second recess region RSRe of the first lower portion LEE The first protrusion part PTP1 of the second lower semiconductor pattern LSP2 may protrude toward the second recess region RSRe of the second lower portion LE2. The first protrusion part PTP1 of the third lower semiconductor pattern LSP3 may protrude toward the second recess region RSRe of the third lower portion LE3. The first protrusion part PTP1 of the first upper semiconductor pattern USP1 may protrude toward the second recess region RSRe of the first upper portion UE1. The first protrusion part PTP1 of the second upper semiconductor pattern USP2 may protrude toward the second recess region RSRe of the second upper portion UE2. The first protrusion part PTP1 of the third upper semiconductor pattern USP3 may protrude toward the second recess region RSRe of the third upper portion UE3.

The second protrusion part PTP2 of the second lower portion LE2 may protrude toward the first recess region RSRc of the first lower semiconductor pattern LSP1. The second protrusion part PTP2 of the second lower portion LE2 may have a shape that corresponds to that of the first recess region RSRc of the first lower semiconductor pattern LSP1. A lowermost end of the second protrusion part PTP2 of the second lower portion LE2 may be located at a lower level than that of an uppermost surface of the first recess part REP1 of the first lower semiconductor pattern LSP1. The second protrusion part PTP2 of the third lower portion LE3 may protrude toward the first recess region RSRc of the second lower semiconductor pattern LSP2. A lowermost end of the second protrusion part PTP2 of the third lower portion LE3 may be located at a lower level than that of an uppermost surface of the first recess part REP1 of the second lower semiconductor pattern LSP2. The second protrusion part PTP2 of the first upper portion UE1 may protrude toward the first recess region RSRc of the third lower semiconductor pattern LSP3. A lowermost end of the second protrusion part PTP2 of the first upper portion UE1 may be located at a lower level than that of an uppermost surface of the first recess part REP1 of the third lower semiconductor pattern LSP3. The second protrusion part PTP2 of the second upper portion UE2 may protrude toward the first recess region RSRc of the first upper semiconductor pattern USP1. A lowermost end of the second protrusion part PTP2 of the second upper portion UE2 may be located at a lower level than that of an uppermost surface of the first recess part REP1 of the first upper semiconductor pattern USP1. The second protrusion part PTP2 of the third upper portion UE3 may protrude toward the first recess region RSRc of the second upper semiconductor pattern USP2. A lowermost end of the second protrusion part PTP2 of the third upper portion UE3 may be located at a lower level than that of an uppermost surface of the first recess part REP1 of the second upper semiconductor pattern USP2. The second protrusion part PTP2 of the fourth upper portion UE4 may protrude toward the first recess region RSRc of the third upper semiconductor pattern USP3. A lowermost end of the second protrusion part PTP2 of the fourth upper portion UE4 may be located at a lower level than that of an uppermost surface of the first recess part REP1 of the third upper semiconductor pattern USP3.

The gate dielectric layer GI may extend along a surface of each of the first and second recess regions RSRc and RSRe.

A reduction in size of the semiconductor device may cause a reduction in length of a channel pattern that connect source/drain patterns to each other, which may result in the occurrence of a short channel effect. Accordingly, there may be induced an increase in high current leakage and subthreshold swing (SS). According to embodiments of inventive concepts, the first to third lower semiconductor patterns LSP1 to LSP3 and the first to third upper semiconductor patterns USP1 to USP3 each may have a downwardly bent shape. Thus, even when the semiconductor device has a reduced size, it may be possible to form the first to third upper semiconductor patterns USP1 to USP3 and the first to third lower semiconductor patterns LSP1 to LSP3 each of which has a relatively large length. As a result, the subthreshold swing may decrease to improve electrical properties of the semiconductor device.

In addition, an increase in distance between the gate electrode GE and the lower and upper source/drain patterns SDd and SDu may occur, and thus a reduction in electric field between the gate electrode GE and the lower and upper source/drain patterns SDd and SDu may occur. Accordingly, there may be a reduction in gate induced drain leakage (GIDL) due to band-to-band tunneling. In conclusion, the semiconductor device may improve in electrical properties.

FIGS. 4 to 10C illustrate cross-sectional views showing a method of fabricating a semiconductor device according to some embodiments of inventive concepts. FIGS. 4, 5, 6A, 7A, 8A, 9A, and 10A illustrate cross-sectional views taken along line A-A' of FIG. 1. FIGS. 6B and 10B illustrate cross-sectional views taken along line B-B' of FIG. 1. FIGS. 7B, 8B, 9B, and 10C illustrate cross-sectional views taken along line C-C' of FIG. 1.

Figure 4:
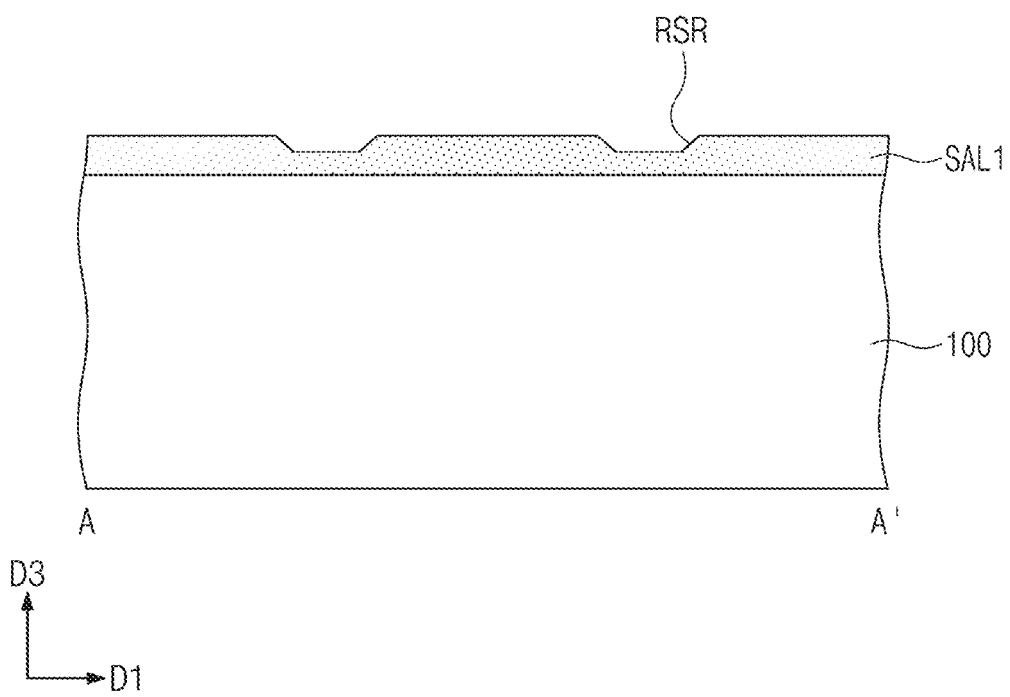
FIGS. 4 to 10C illustrate cross-sectional views showing a method of fabricating a semiconductor device according to some embodiments of inventive concepts.

Referring to FIG. 4, a first sacrificial layer SAL1 may be formed on a substrate 100. The first sacrificial layer SAL1 may include one of silicon (Si), germanium (Ge), and silicon-germanium (SiGe). For example, the first sacrificial layer SAL1 may include silicon-germanium (SiGe). A concentration of germanium (Ge) contained in the first sacrificial layer SAL1 may range from about 10 at % to about 30 at %.

An upper portion of the first sacrificial layer SAL1 may be etched to form recess regions RSR. For example, a first etching mask pattern may be formed on the first sacrificial layer SAL1, and the first etching mask pattern may be used as an etching mask to etch a portion of the first sacrificial layer SAL1. The recess region RSR may be an area that is recessed from a top surface of the first sacrificial layer SAL1. A bottom surface of the recess region RSR may be spaced apart from the substrate 100. The recess region RSR may have a width that decreases in a direction toward the substrate 100.

Figure 5:
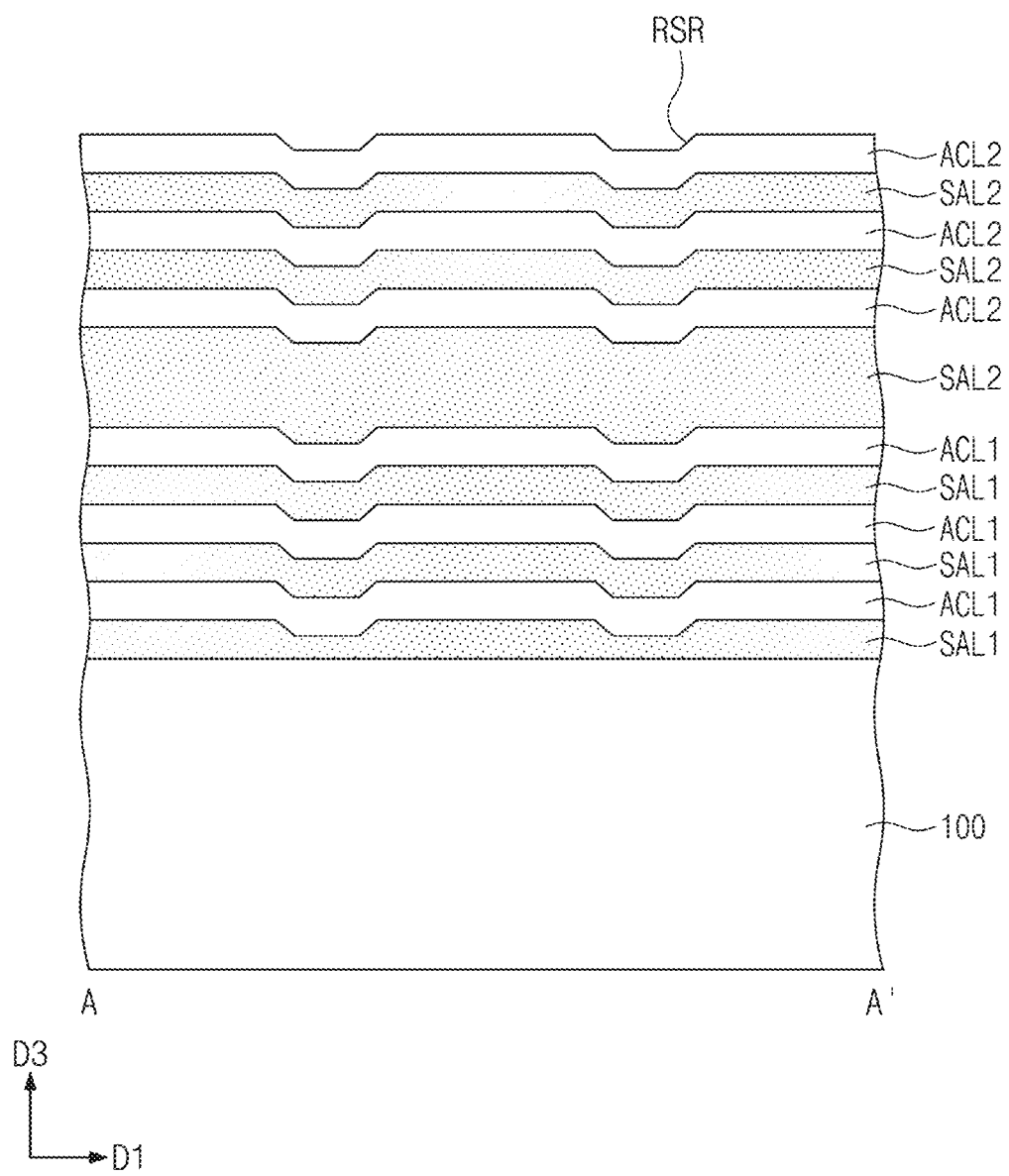

Referring to FIG. 5, first active layers ACL1 and first sacrificial layers SAL1 may be alternately stacked. The first active layers ACL1 may include one of silicon (Si), germanium (Ge), and silicon-germanium (SiGe), which one is different from the aforementioned one included in the first sacrificial layers SAL1. For example, the first active layers ACL1 may include silicon (Si).

The first active layers ACL1 and the first sacrificial layers SAL1 may have, on their top surfaces, their recess regions RSR that correspond to the recess region RSR of the lowermost first sacrificial layer SAL1. The recess regions RSR may have a shape the same as or similar to that of the recess region RSR of the lowermost first sacrificial layer SAL1.

Second sacrificial layers SAL2 and second active layers ACL2 may be alternately stacked on an uppermost first active layer ACL1. The second sacrificial layers SAL2 may include the same material as that of the first sacrificial layers SAL1. The second active layers ACL2 may include the same material as that of the first active layers ACL1. For example, the second sacrificial layers SAL2 may include silicon-germanium, and the second active layers ACL2 may include silicon.

A lowermost second sacrificial layer SAL2 may have a relatively large thickness. The lowermost second sacrificial layer SAL2 may be thicker than the first sacrificial layers SAL1, the first active layers ACL1, the second active layers ACL2, and other second sacrificial layers SAL2.

The second sacrificial layers SAL2 and the second active layers ACL2 may have on their top surfaces, their recess regions RSR that correspond to the recess region RSR of the lowermost first sacrificial layer SAL1. The recess regions RSR may have a shape the same as or similar to that of the recess region RSR of the lowermost first sacrificial layer SAL1.

Figure 6A:
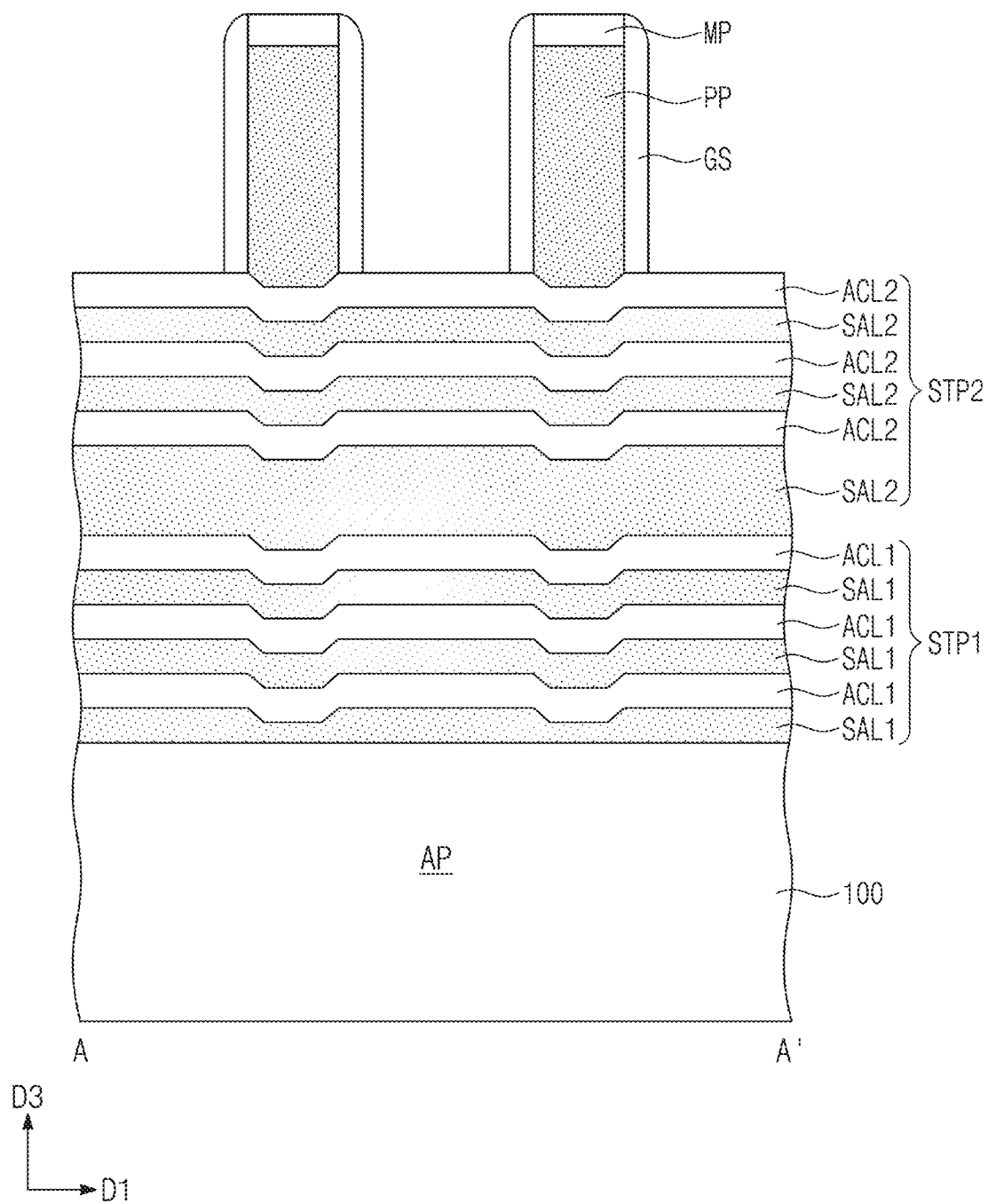
Figure 6B:
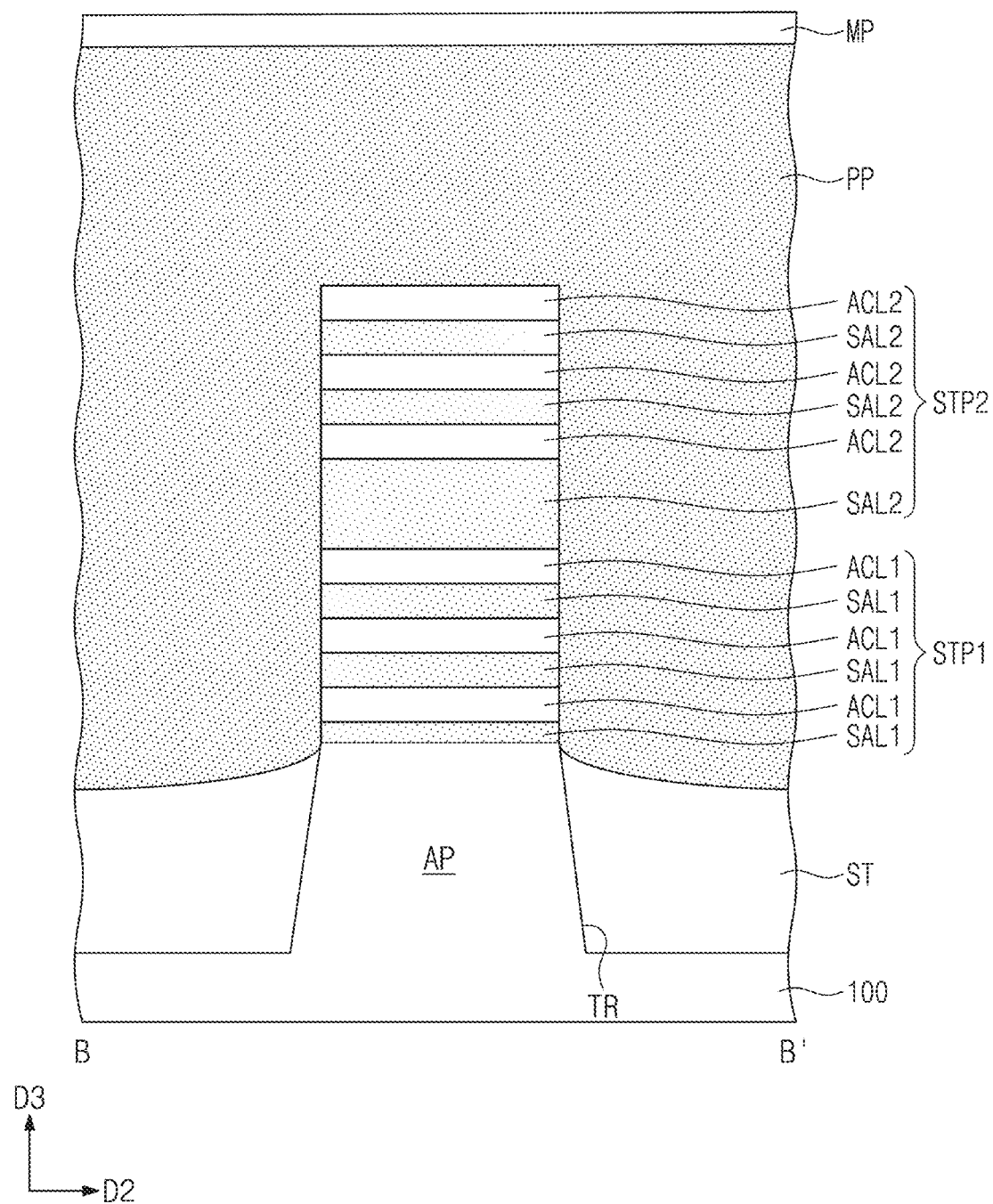

Referring to FIGS. 6A and 6B, an active pattern AP, a lower stack pattern STP1, and an upper stack pattern STP2 may be formed on the substrate 100. For example, a second etching mask pattern may be formed on an uppermost second active layer ACL2. The second etching mask pattern may have a linear or bar shape that extends in a first direction D1. A patterning process may be performed in which the second etching mask patterns are used to form trenches TR. The trenches TR may be formed on an upper portion of the substrate 100 to extend in the first direction D1. The trenches TR may define the active pattern AP therebetween. For example, the trenches TR each may have a width in a second direction D2 that decreases in a direction toward a bottom surface of the substrate 100, and the active pattern AP may have a width in the second direction D2 that increases in a direction toward the bottom surface of the substrate 100.

The lower stack pattern STP1 and the upper stack pattern STP2 may be formed to vertically overlap the active pattern AP. The lower stack pattern STP1 and the upper stack pattern STP2 may be etched together with the substrate 100, thereby extending in the first direction D1. The lower stack pattern STP1 may include the first sacrificial layers SAL1 and the first active layers ACL1 that are alternately stacked on a top surface of the active pattern AP. The upper stack pattern STP2 may include the second sacrificial layers SAL2 and the second active layers ACL2 that are alternately stacked.

A device isolation layer ST may be formed to fill the trenches TR. For example, a dielectric layer may be formed on an entire surface of the substrate 100, covering the lower and upper stack patterns STP1 and STP2. The dielectric layer may be recessed until the lower stack patterns STP1 are exposed, and accordingly the device isolation layer ST may be formed. The device isolation layer ST may include a dielectric material, such as a silicon oxide layer. Neither the lower stack pattern STP1 nor the upper stack pattern STP2 may be covered with the device isolation layer ST. For example, the lower stack pattern STP1 may protrude vertically and upwardly from the device isolation layer ST.

Sacrificial patterns PP may be formed on the substrate 100, running across the lower and upper stack patterns STP1 and STP2. Each of the sacrificial patterns PP may be formed to have a linear or bar shape that extends in the second direction D2. The sacrificial patterns PP may be arranged at a certain pitch along the first direction D1. For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include, for example, polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multiple layer including at least two selected from SiCN, SiCON, and SiN.

Figure 7A:
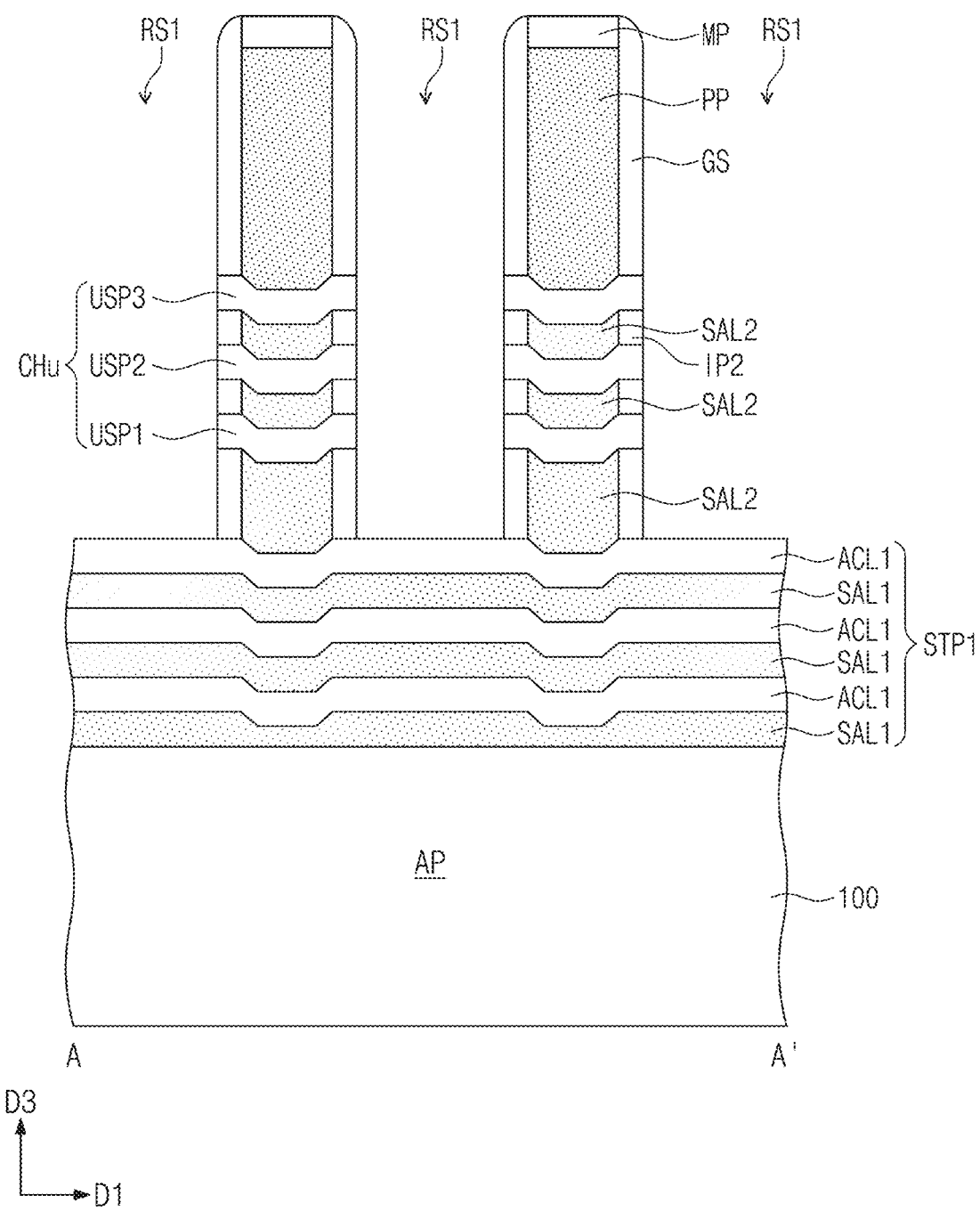
Figure 7B:
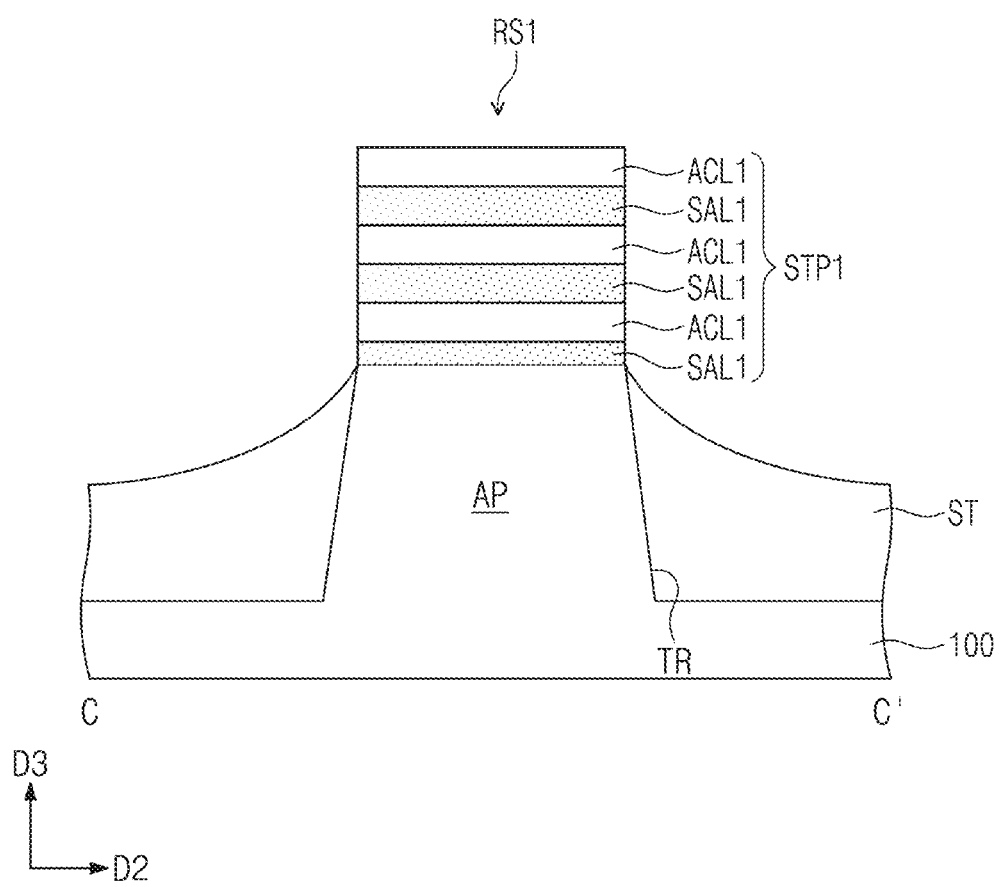

Referring to FIGS. 7A and 7B, first recesses RS1 may be formed in the upper stack pattern STP2. The device isolation layer ST on opposite sides of the active pattern AP may be recessed while the first recesses RS1 are formed.

For example, the first recesses RS1 may be formed by using the hardmask patterns MP and the gate spacers GS as an etching mask to etch the upper stack pattern STP2 on the active pattern AP. The first recesses RS1 may be formed to extend toward a top surface of the substrate 100 from spaces on sidewalls of the sacrificial patterns PP.

A plurality of first recesses RS1 may be arranged in the first direction D1. An upper channel pattern CHu may be formed to include first to third upper semiconductor patterns USP1 to USP3 between a pair of first recesses RS1. The first to third upper semiconductor patterns USP1 to USP3 may be stacked alternately with and vertically spaced apart from the second sacrificial layers SAL2.

Upper inner spacers IP2 may be formed on lateral surfaces of the second sacrificial layers SAL2. For example, the lateral surfaces of the second sacrificial layers SAL2 exposed to the first recess RS1 may be partially etched. A dielectric layer may be formed to fill spaces where the second sacrificial layers SAL2 are partially removed. The dielectric layer may be etched to form the upper inner spacers IP2 that are vertically spaced apart from each other. The upper inner spacers IP2 may be formed between neighboring first to third upper semiconductor patterns USP1 to USP3, and may have their sidewalls correspondingly aligned with those of the first to third upper semiconductor patterns USP1 to USP3.

Figure 8A:
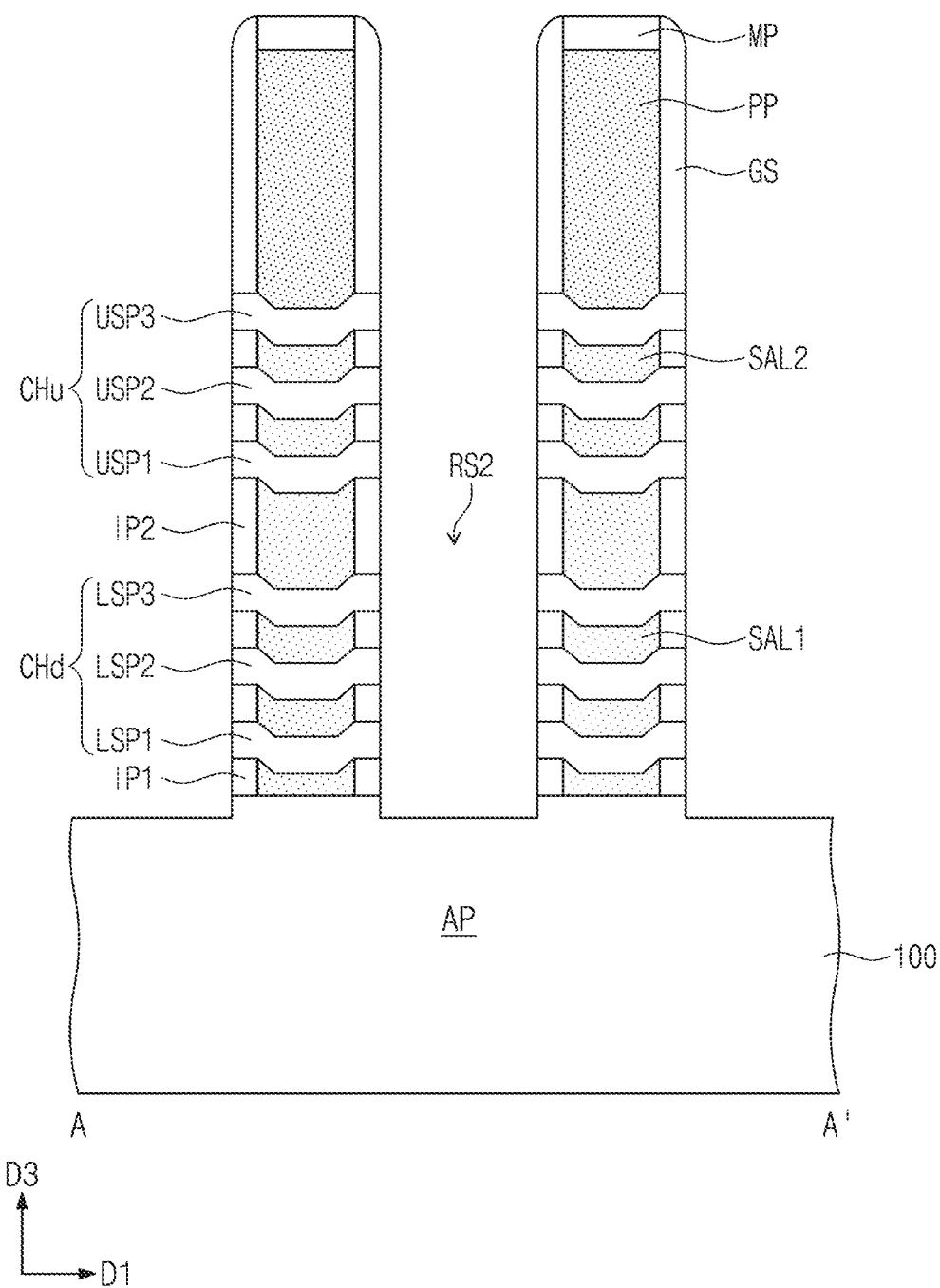
Figure 8B:
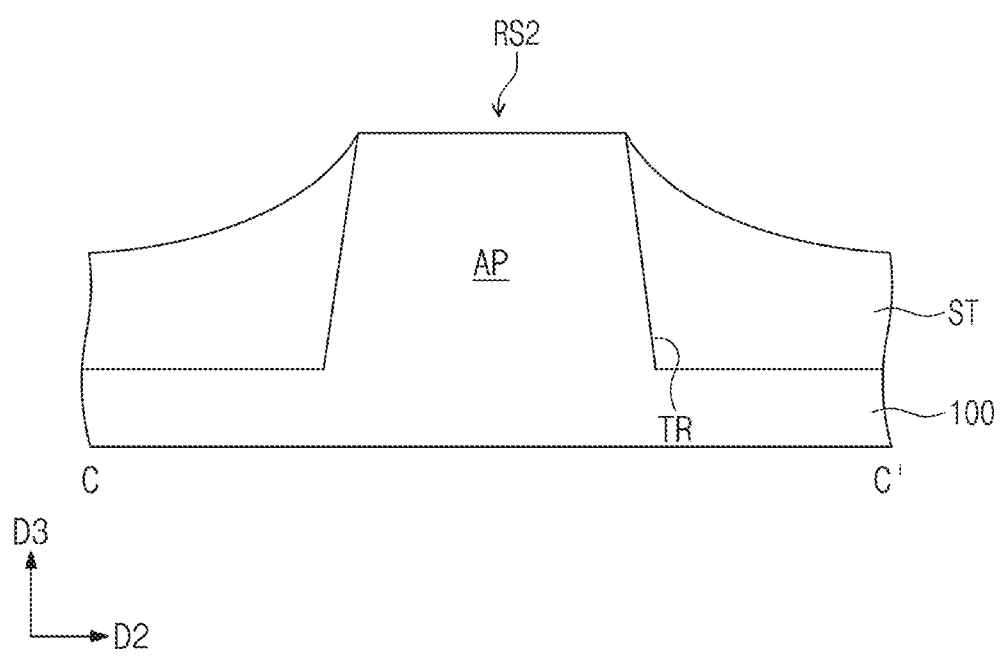

Referring to FIGS. 8A and 8B, the first recesses RS1 may further be recessed to form second recesses RS2. The device isolation layer ST on opposite sides of the active pattern AP may be recessed while the second recesses RS2 are formed.

For example, the hardmask patterns MP and the gate spacers GS may be used as an etching mask to etch the lower stack pattern STP1 to form the second recesses RS2 deeper than the first recesses RS1. The second recesses RS2 may have their bottom surfaces located at a lower level than that of an uppermost surface of the active pattern AP. The bottom surfaces of the second recesses RS2 may be located at a lower level than that of a bottom surface of a lowermost one of the first sacrificial layers SAL1.

A lower channel pattern CHd may be formed to include first to third lower semiconductor patterns LSP1 to LSP3 between the second recesses RS2. The first to third lower semiconductor patterns LSP1 to LSP3 may be stacked alternately with and spaced apart from the first sacrificial layers SAL1.

Thereafter, lower inner spacers IP1 may be formed on lateral surfaces of the first sacrificial layers SAL1. For example, the lateral surfaces of the first sacrificial layers SAL1 exposed to the second recess RS2 may be partially etched. A dielectric layer may be formed to fill spaces where the first sacrificial layers SAL1 are partially removed. The dielectric layer may be etched to form the lower inner spacers IP1 that are vertically spaced apart from each other. The lower inner spacers IP1 may be formed between neighboring first to third lower semiconductor patterns LSP1 to LSP3, and may have their sidewalls correspondingly aligned with those of the first to third lower semiconductor patterns LSP1 to LSP3.

Figure 9A:
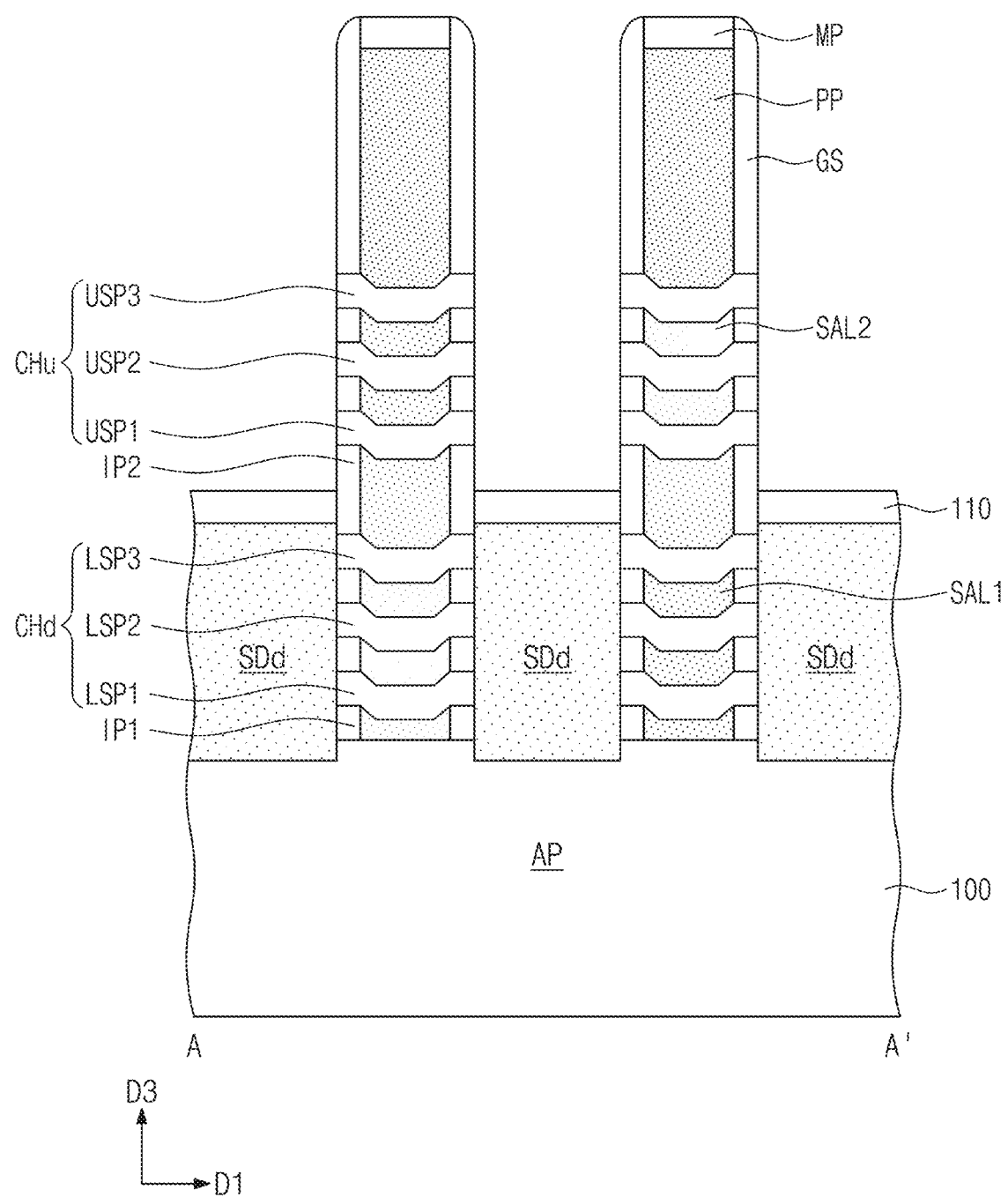
Figure 9B:
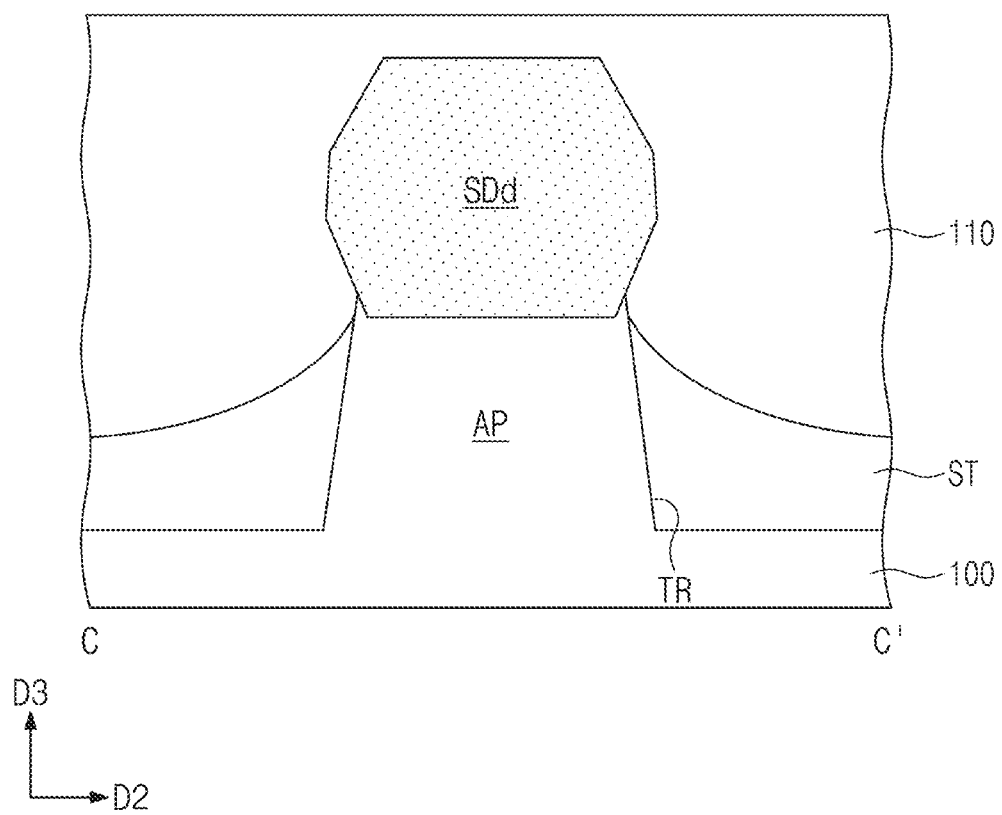

Referring to FIGS. 9A and 9B, lower source/drain patterns SDd may be correspondingly formed in the second recesses RS2. For example, the lower source/drain patterns SDd may be formed by performing a first selective epitaxial growth (SEG) process in which sidewalls of the first to third lower semiconductor patterns LSP1 to LSP3 are used as seed layers, and in which the top surface of the active pattern AP is also used as a seed layer. For example, the first SEG process may include chemical vapor deposition (CVD) or molecular beam epitaxy (MBE). The lower source/drain patterns SDd may include, for example, the same semiconductor element (e.g., Si) as that of the substrate 100.

Although not shown, before the formation of the lower source/drain patterns SDd, a barrier layer may be formed to cover sidewalls of the first to third upper semiconductor patterns USP1 to USP3. Therefore, the sidewalls of the first to third upper semiconductor patterns USP1 to USP3 may not be exposed while the first SEG is performed. Therefore, the lower source/drain patterns SDd may be selectively grown in lower portions of the second recesses RS2. The barrier layer may be removed after the formation of the lower source/drain patterns SDd.

A first interlayer dielectric layer 110 may be formed on the lower source/drain patterns SDd. The formation of the first interlayer dielectric layer 110 may include forming a dielectric layer that covers the lower source/drain patterns SDd, and etching the dielectric layer until a top surface of the dielectric layer is located at a lower level than that of a top surface of a lowermost second sacrificial layer SAL2. The first interlayer dielectric layer 110 may have a flat top surface. The first interlayer dielectric layer 110 may have a bottom surface that covers a top surface of the device isolation layer ST. The first interlayer dielectric layer 110 may have a bottom surface that convexly protrudes toward a bottom surface of the trench TR.

Figure 10A:
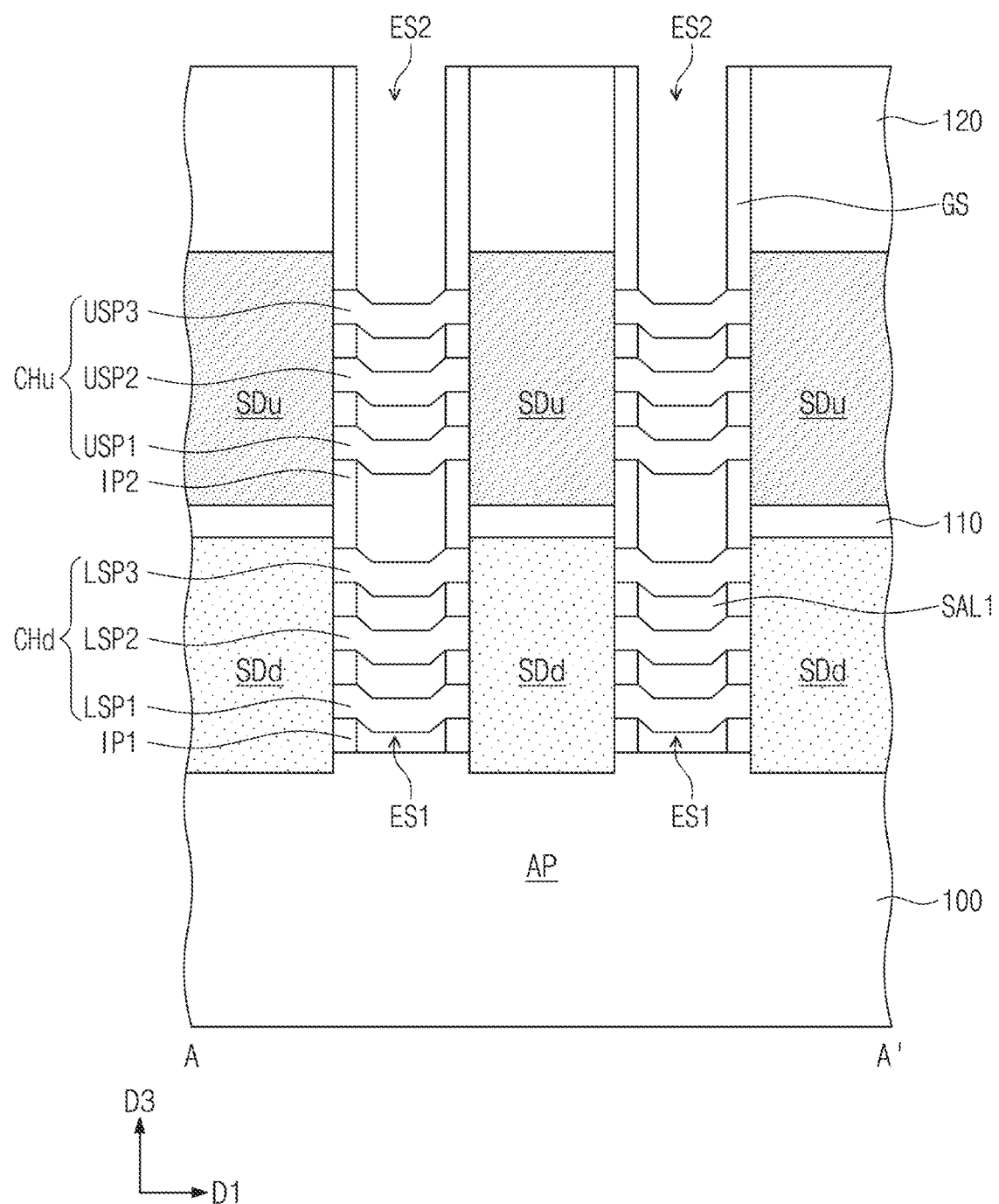
Figure 10B:
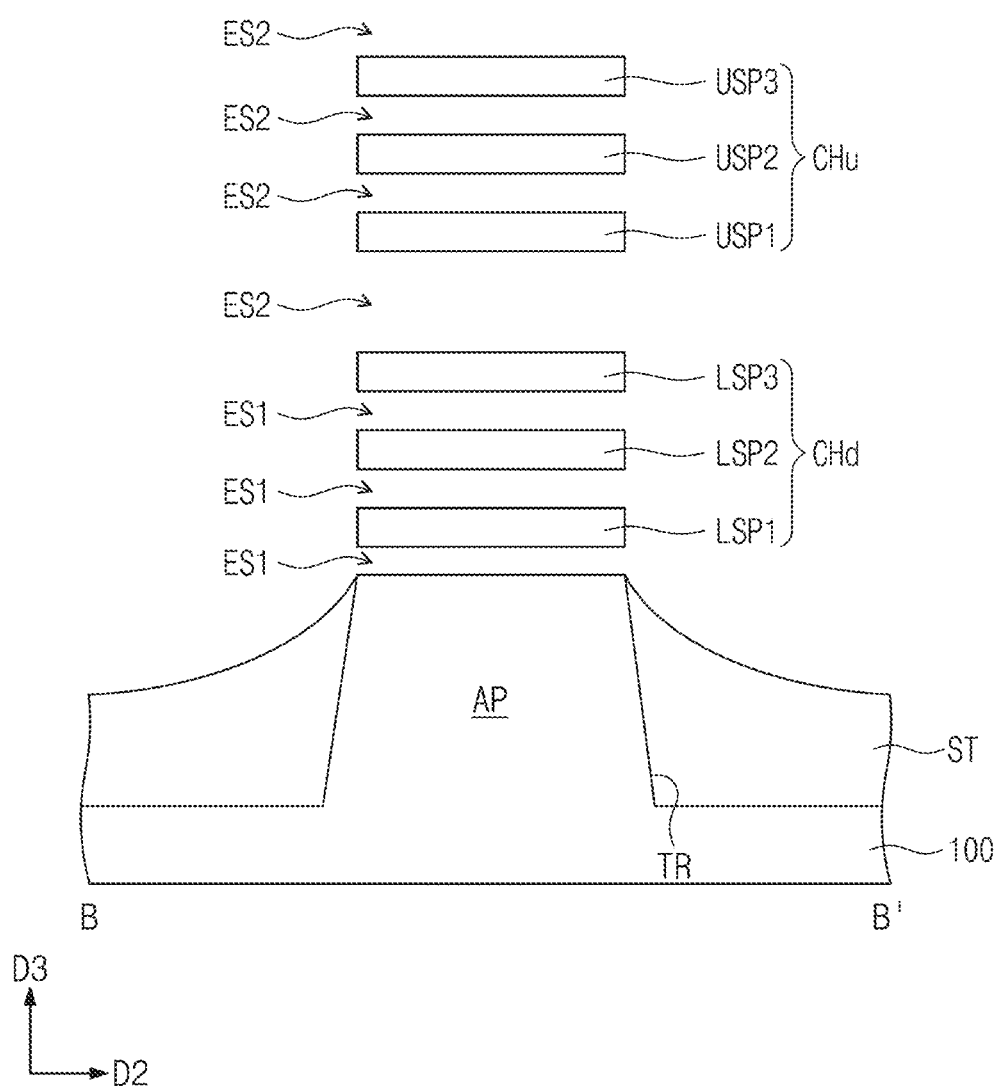
Figure 10C:
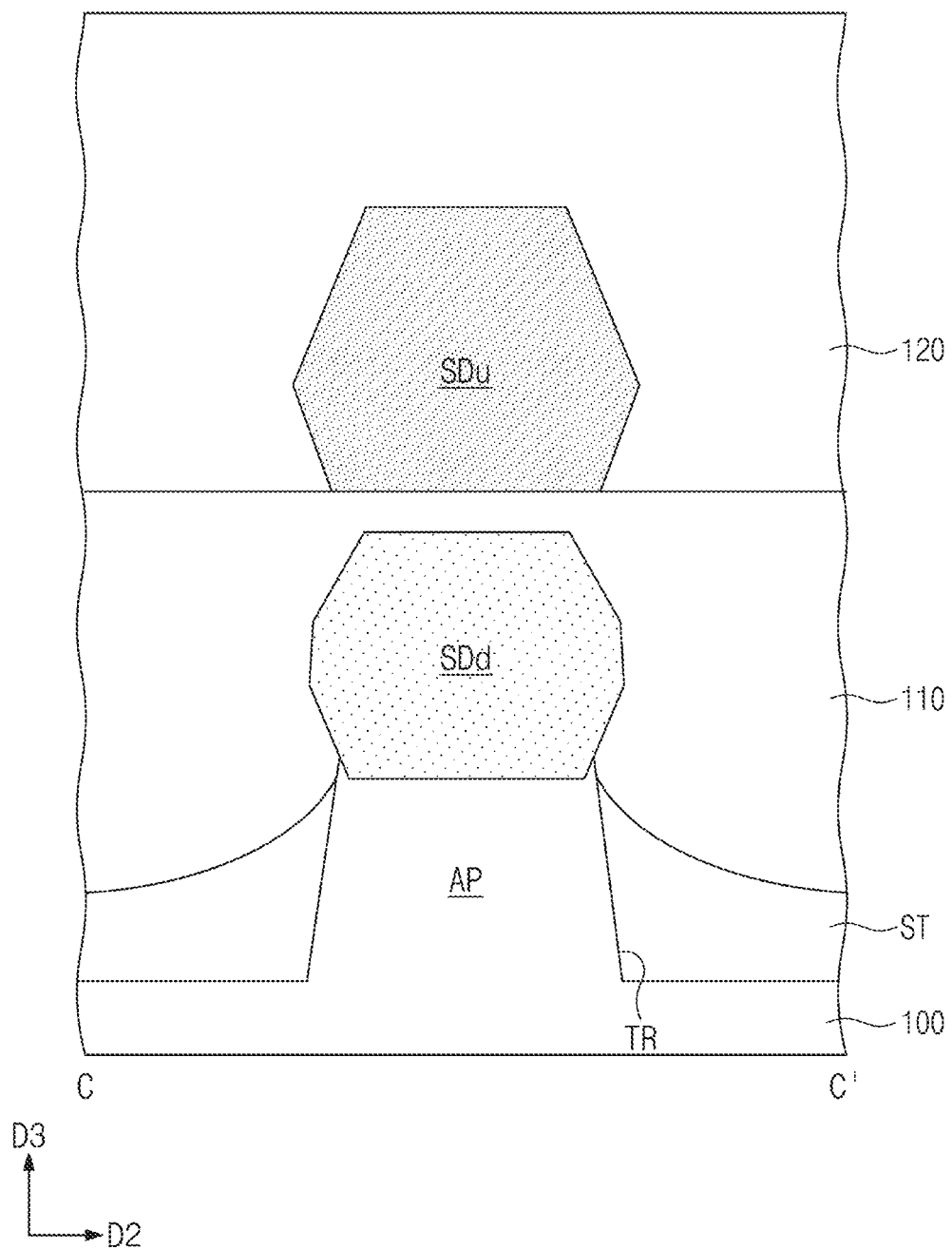

Referring to FIGS. 10A to 10C, upper source/drain patterns SDu may be formed on the top surface of the first interlayer dielectric layer 110. For example, a second SEG process may be performed in which the sidewalls of the first to third upper semiconductor patterns USP1 to USP3 are used as a seed layer to form a first semiconductor section that covers the sidewalls of the sidewalls of the first to third upper semiconductor patterns USP1 to USP3. The first semiconductor section may include a semiconductor element or compound (e.g., SiGe) whose lattice constant is greater than that of a semiconductor element of the substrate 100. The first semiconductor section may contain germanium (Ge) whose concentration is relatively low. According to some embodiments, the first semiconductor section may include silicon (Si), but may not include germanium (Ge). A concentration of germanium (Ge) contained in the first semiconductor section may range from about 0 at % to about 10 at %.

The first semiconductor section may undergo a third SEG process to form a second semiconductor section. The second semiconductor section may contain germanium (Ge) whose concentration is relatively high. For example, a concentration of germanium (Ge) contained in the second semiconductor section may range from about 30 at % to about 70 at %. The first semiconductor section and the second semiconductor section may constitute the upper source/drain pattern SDu. According to some embodiments, impurities may be in-situ implanted during the second and third SEG processes. Alternatively, after the formation of the upper source/drain pattern SDu, impurities may be implanted into the upper source/drain pattern SDu. The upper source/drain pattern SDu may be doped to have a second conductivity type (e.g., p-type).

A second interlayer dielectric layer 120 may be formed to cover the upper source/drain patterns SDu and the gate spacers GS. For example, the second interlayer dielectric layer 120 may include a silicon oxide layer. The second interlayer dielectric layer 120 may be planarized until top surfaces of the sacrificial patterns PP are exposed. An etch-back or chemical mechanical polishing (CMP) process may be employed to planarize the second interlayer dielectric layer 120. The hardmask patterns MP may all be removed during the planarization process. As a result, the second interlayer dielectric layer 120 may have a top surface coplanar with those of the sacrificial patterns PP and those of the gate spacers GS.

An etching process may be used to selectively remove the sacrificial patterns PP, the first sacrificial layers SAL1, and the second sacrificial layers SAL2. The etching process may be a wet etching process. The first sacrificial layers SAL1 may be removed to form first empty spaces ES1. The second sacrificial layers SAL2 and the sacrificial patterns PP may be removed to form second empty spaces ES2.

Referring back to FIGS. 1, 2A to 2C, and 3, a gate dielectric layer GI may be conformally formed in the first and second empty spaces ES1 and ES2. A gate electrode GE may be formed on the gate dielectric layer GI. The gate electrode GE may be formed to fill the first and second empty spaces ES1 and ES2. According to some embodiments, the formation of the gate electrode GE may include forming a first metal pattern in the first and second empty spaces ES1 and ES2, and forming a second metal pattern that fills unoccupied portions of the first and second empty spaces ES1 and ES2. The first metal pattern may include a plurality of stacked work-function metal layers. The second metal pattern may include metal whose resistance is less than that of the first metal pattern. Afterwards, a gate capping pattern GP may be formed on the gate electrode GE. First, second, and third active contacts AC1, AC2, and AC3 may be formed coupled to the lower source/drain patterns SDd and the upper source/drain patterns SDu.

Figure 11:
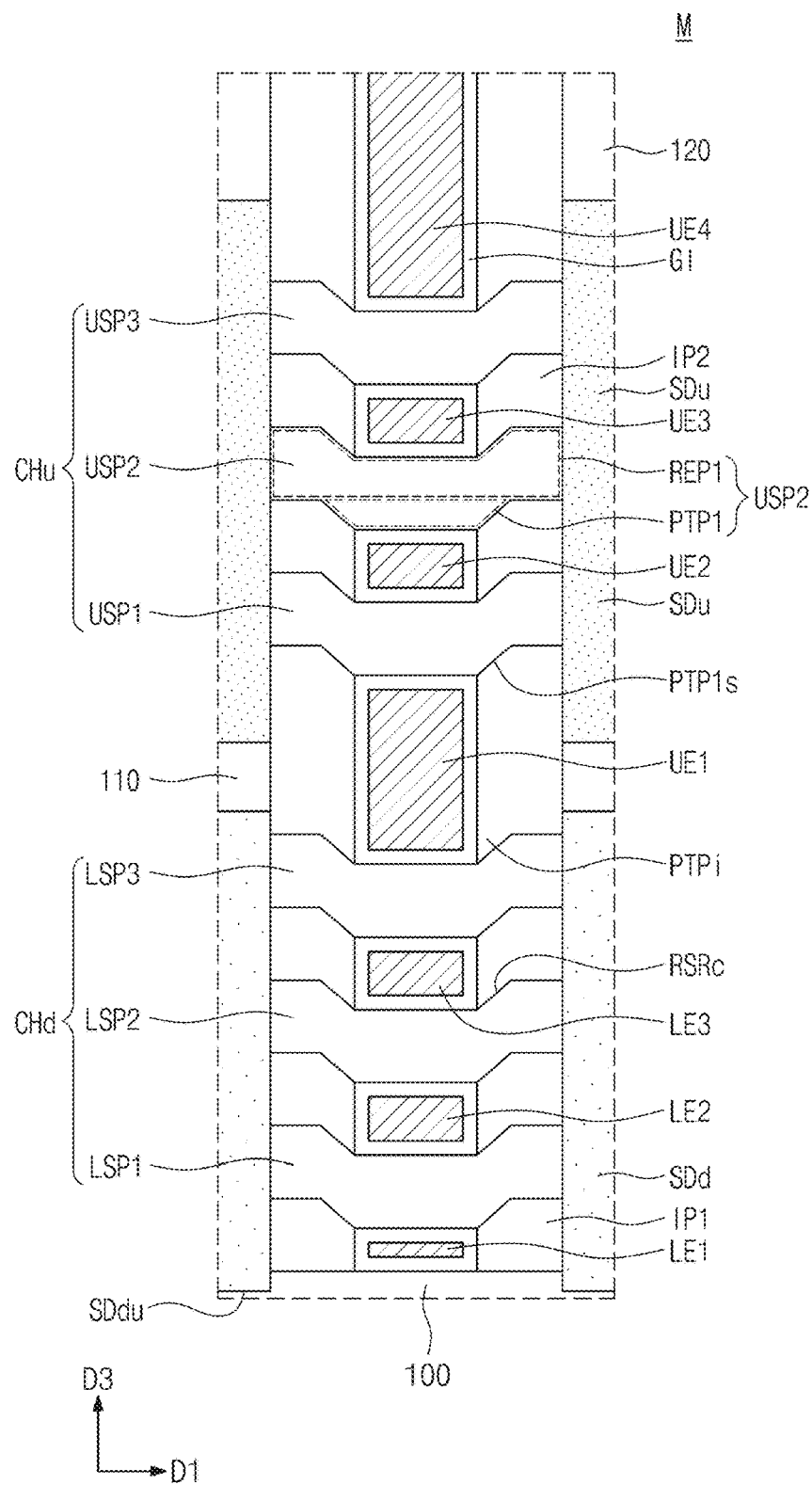
FIGS. 11 to 13 illustrate enlarged cross-sectional views of section M depicted in FIG. 2A, showing a semiconductor device according to some embodiments of inventive concepts.
Figure 12:
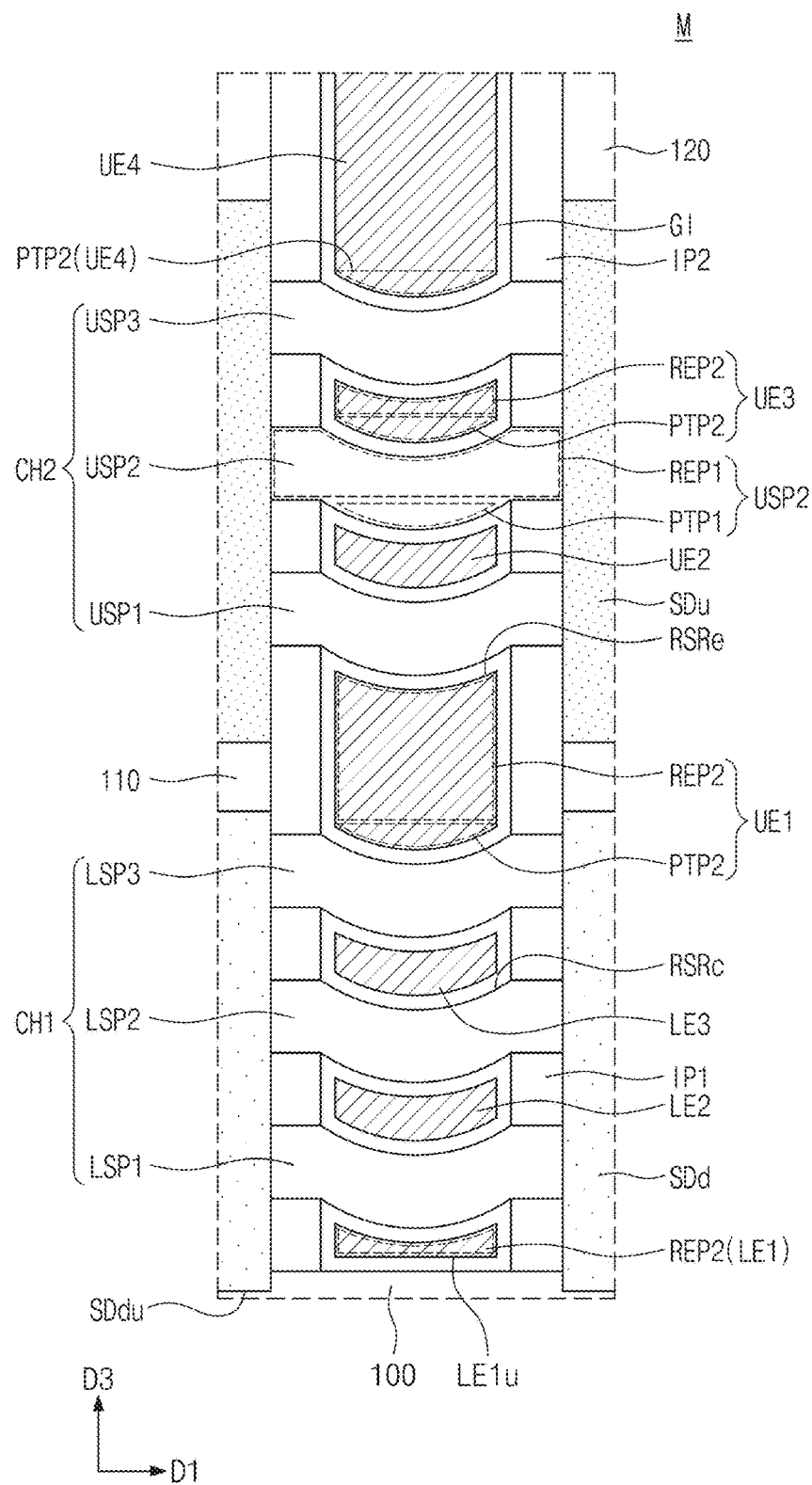
Figure 13:
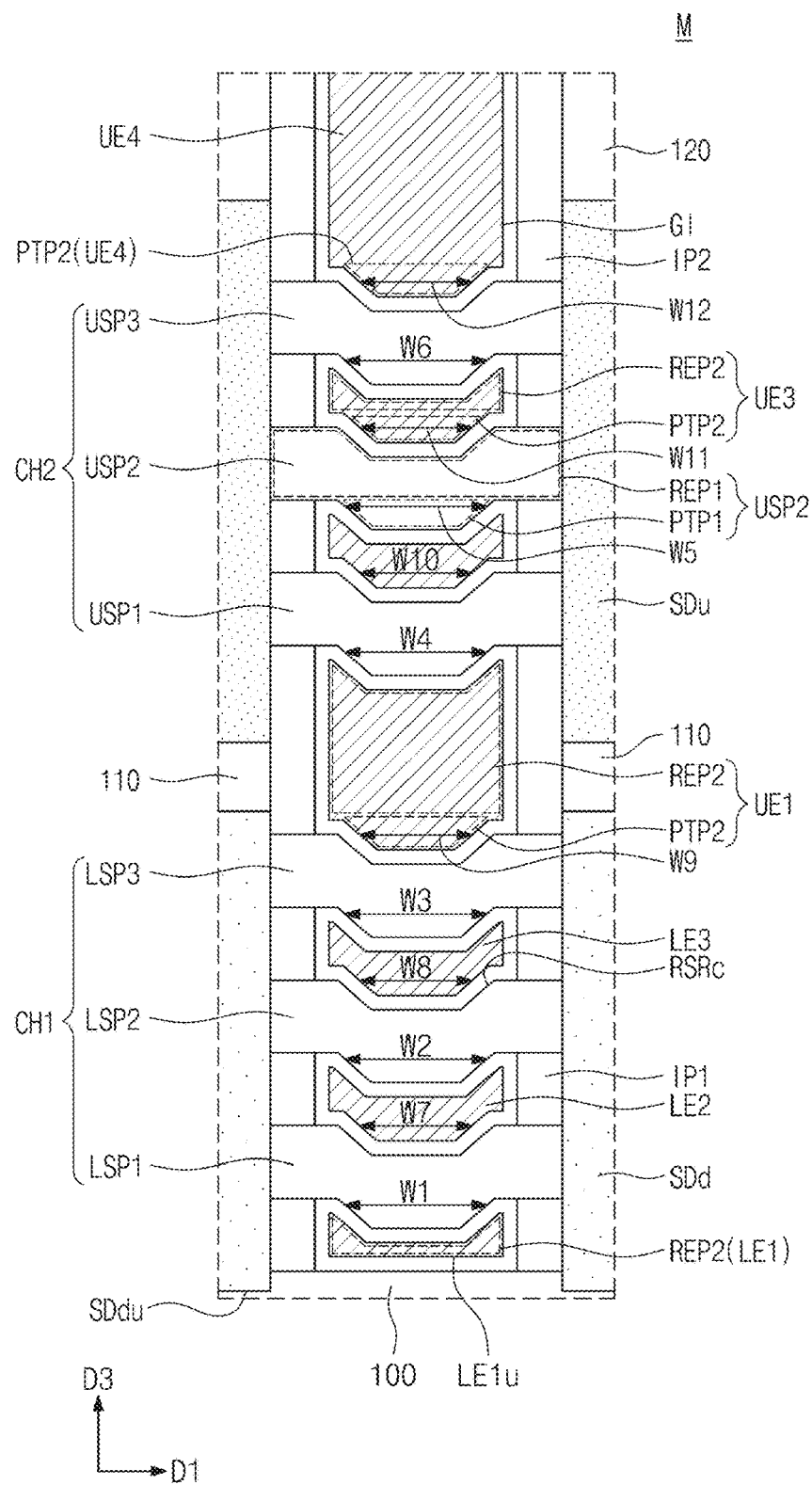

FIGS. 11 to 13 illustrate enlarged cross-sectional views of section M depicted in FIG. 2A, showing a semiconductor device according to some embodiments of inventive concepts. In the embodiment that follows, a detailed description of technical features repetitive to those formerly discussed with reference to FIGS. 1, 2A to 2C, and 3 will be omitted, and a difference thereof will be discussed in detail.

Referring to FIG. 11, the lower inner spacers IP1 may correspondingly extend toward the first recess regions RSRc of the first and second lower semiconductor patterns LSP1 and LSP2. The lower inner spacers IP1 may correspondingly contact sidewalls PTP1s of the first protrusion parts PTP1 included in the first to third lower semiconductor patterns LSP1 to LSP3.

The upper inner spacers IP2 may correspondingly extend toward the first recess regions RSRc of the first to third upper semiconductor patterns USP1 to USP3. The upper inner spacers IP2 may contact sidewalls PTP1s of the first protrusion parts PTP1 included in the first to third upper semiconductor patterns USP1 to USP3. A lowermost upper inner spacer IP2 may extend into the first recess region RSRc of the third lower semiconductor pattern LSP3. For example, one of the upper and lower inner spacers IP2 and IP1 may include a third protrusion part PTPi that protrudes toward the first recess region RSRc of a corresponding one of the first to third upper and lower semiconductor patterns USP1 to USP3 and LSP1 to LSP3, which corresponding one is positioned below the one of the upper and lower inner spacers IP2 and IP1.

For example, neither the first to fourth upper portions UE1 to UE4 nor the first to third lower portions LE1 to LE3 may include the second recess region RSRe and the second protrusion part PTP2 that are discussed with reference to FIG. 3.

Referring to FIG. 12, the first protrusion part PTP1 may have a bottom surface whose profile is convex toward the substrate 100. The second protrusion part PTP2 may have a bottom surface whose profile is also convex toward the substrate 100. The first recess region RSRc may have a bottom surface having a concave profile. The second recess region RSRe may have a bottom surface having a concave profile. The bottom surface of the first protrusion part PTP1 may have a profile that corresponds to that of the bottom surface of the second recess region RSRe, and the bottom surface of the second protrusion part PTP2 may have a profile that corresponds to that of the bottom surface of the first recess region RSRc.

Referring to FIG. 13, a first width W1 may be given as a maximum width in the first direction D1 of the first protrusion part PTP1 of the first lower semiconductor pattern LSP1. A second width W2 may be given as a maximum width in the first direction D1 of the first protrusion part PTP1 of the second lower semiconductor pattern LSP2. A third width W3 may be given as a maximum width in the first direction D1 of the first protrusion part PTP1 of the third lower semiconductor pattern LSP3. A fourth width W4 may be given as a maximum width in the first direction D1 of the first protrusion part PTP1 of the first upper semiconductor pattern USP1. A fifth width W5 may be given as a maximum width in the first direction D1 of the first protrusion part PTP1 of the second upper semiconductor pattern USP2. A sixth width W6 may be given as a maximum width in the first direction D1 of the first protrusion part PTP1 of the third upper semiconductor pattern USP3. The second width W2 may be less than the first width W1. The third width W3 may be less than the second width W2. The fourth width W4 may be less than the third width W3. The fifth width W5 may be less than the fourth width W4. The sixteenth width W16 may be less than the fifth width W5.

A seventh width W7 may be given as a maximum width in the first direction D1 of the second protrusion part PTP2 of the second lower portion LE2. An eighth width W8 may be given as a maximum width in the first direction D1 of the second protrusion part PTP2 of the third lower portion LE3. A ninth width W9 may be given as a maximum width in the first direction D1 of the second protrusion PTP2 of the first upper portion UE1. A tenth width W10 may be given as a maximum width in the first direction D1 of the second protrusion PTP2 of the second upper portion UE2. An eleventh width W11 may be given as a maximum width in the first direction D1 of the second protrusion PTP2 of the third upper portion UE3. A twelfth width W12 may be given as a maximum width in the first direction D1 of the second protrusion PTP2 of the fourth upper portion UE4. The eighth width W8 may be less than the seventh width W7. The ninth width W9 may be less than the eighth width W8. The tenth width W10 may be less than the ninth width W9. The eleventh width W11 may be less than the tenth width W10.

The twelfth width W12 may be less than the eleventh width W11.

Figure 14:
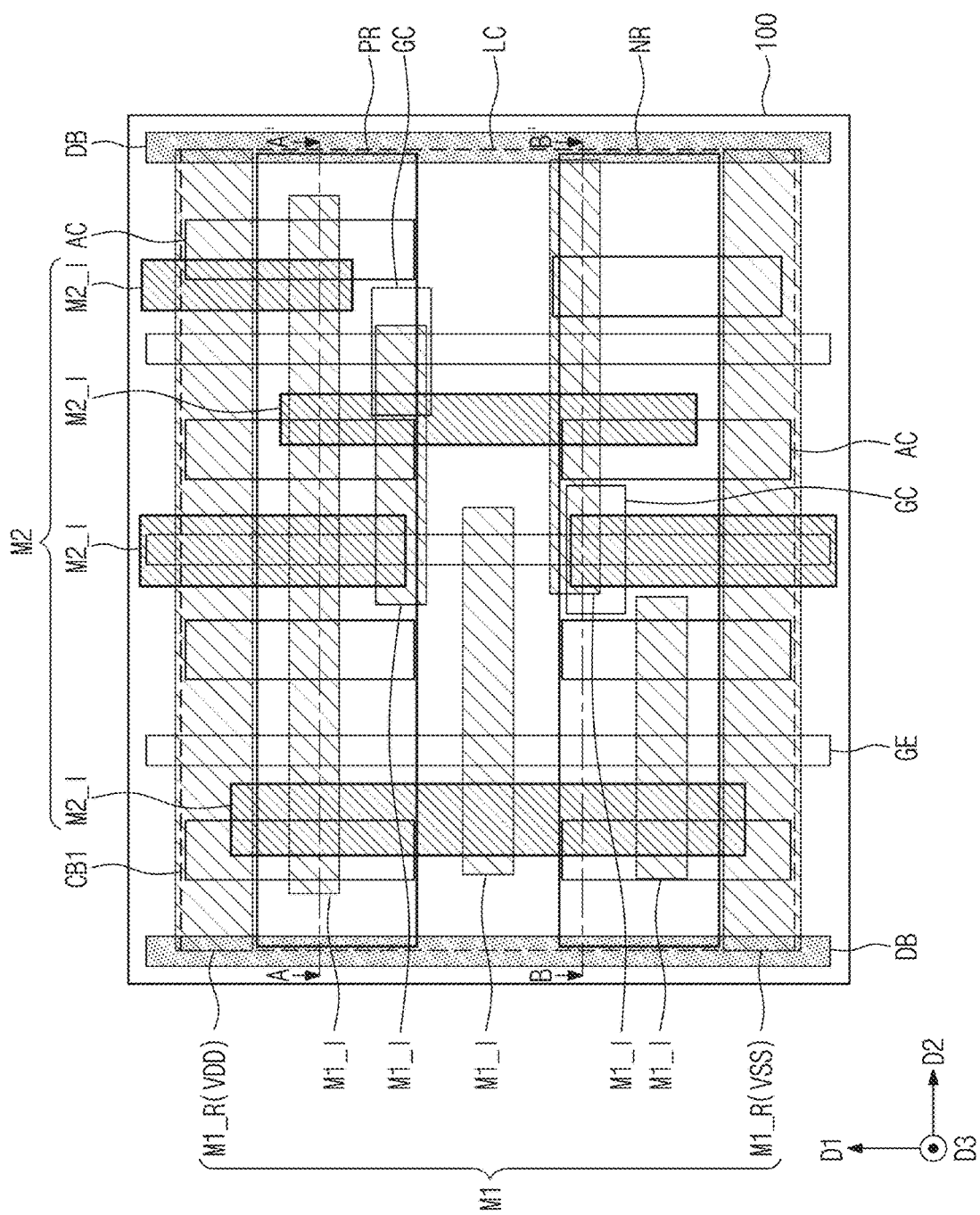
FIG. 14 illustrates a plan view showing a semiconductor device according to some embodiments of inventive concepts.
Figure 15A:
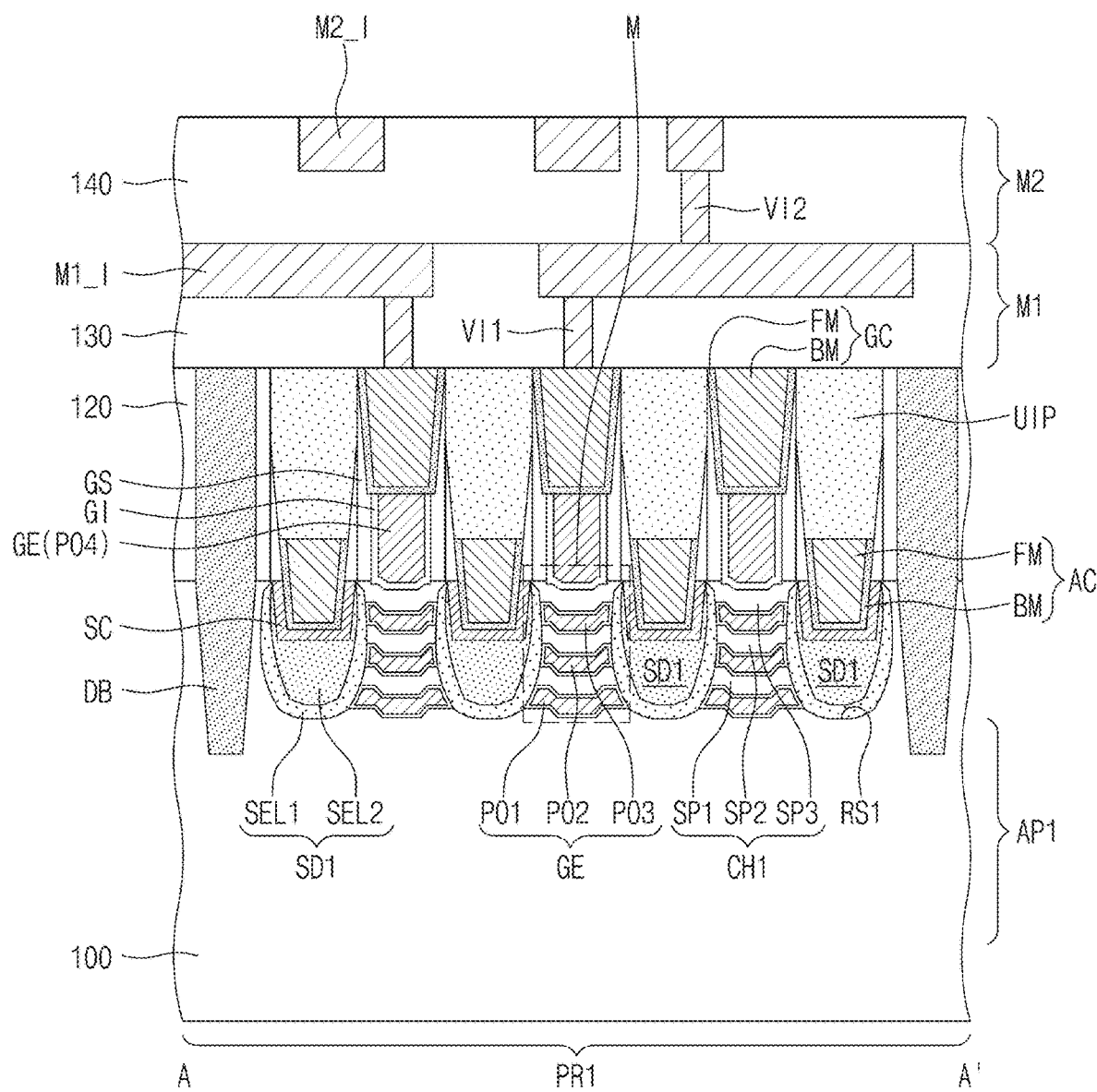
FIGS. 15A and 15B illustrate cross-sectional views respectively taken along lines A-A' and B-B' of FIG. 1.
Figure 15B:
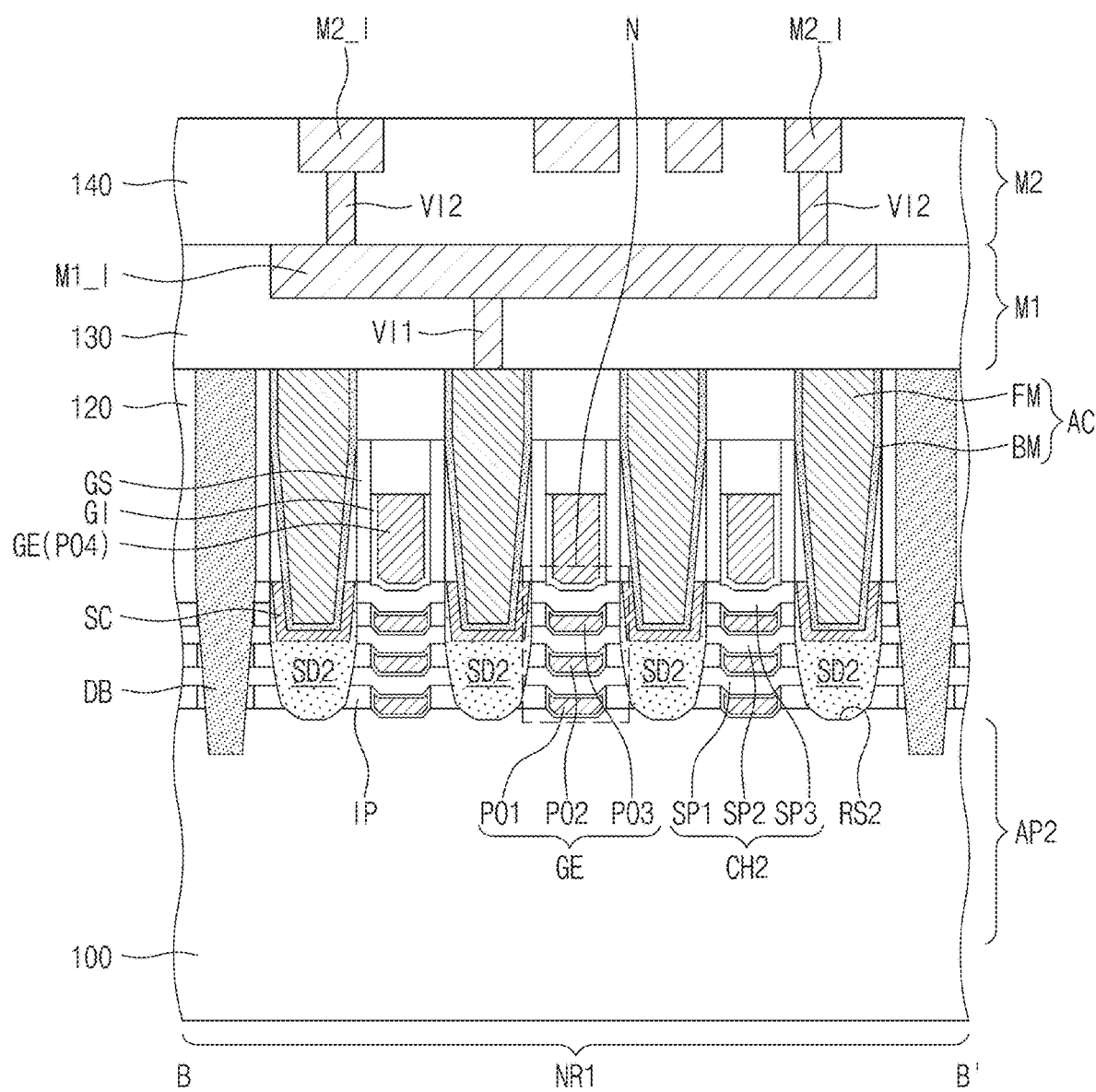
Figure 16A:
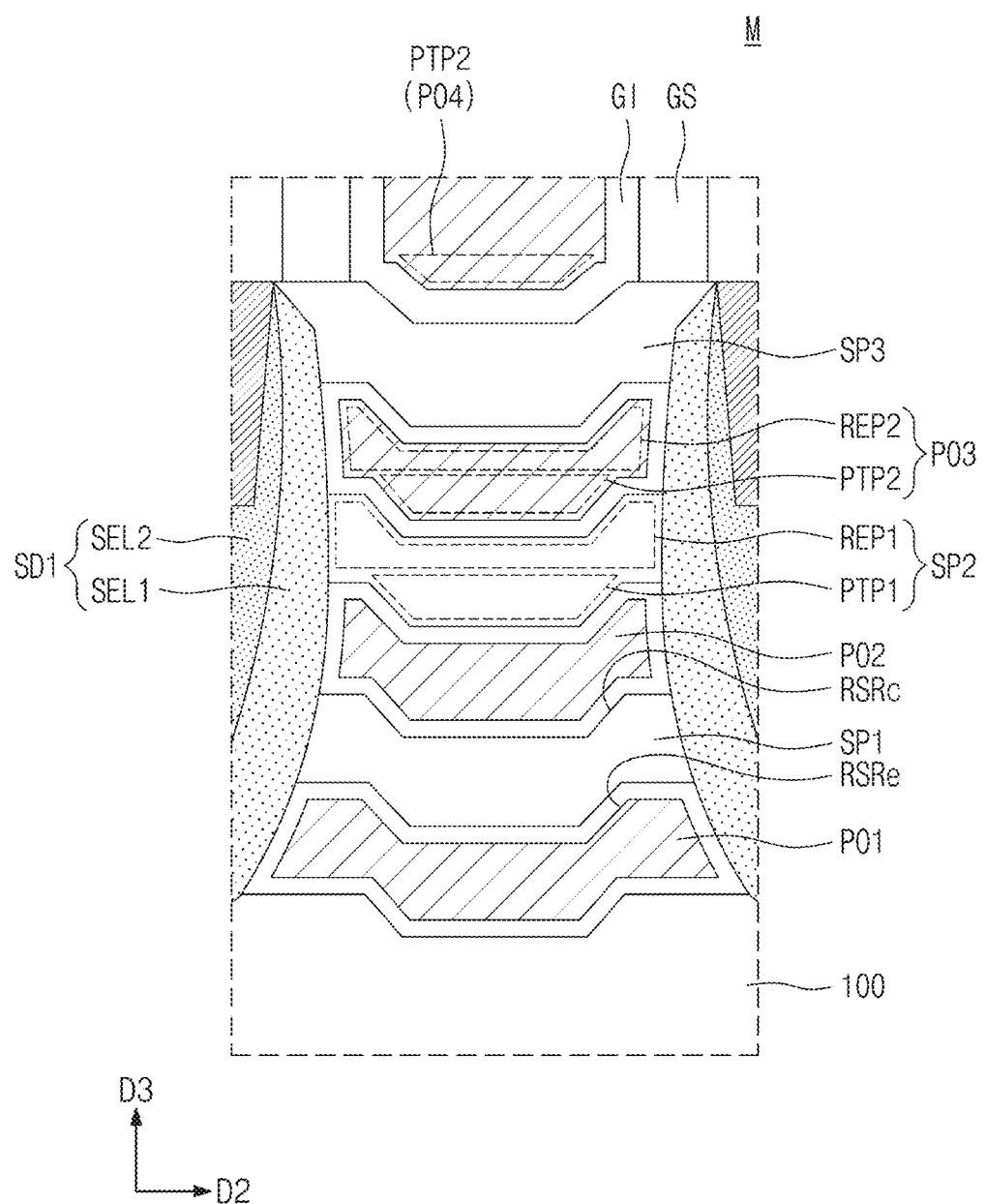
FIG. 16A illustrates an enlarged cross-sectional view showing section M of FIG. 15A.
Figure 16B:
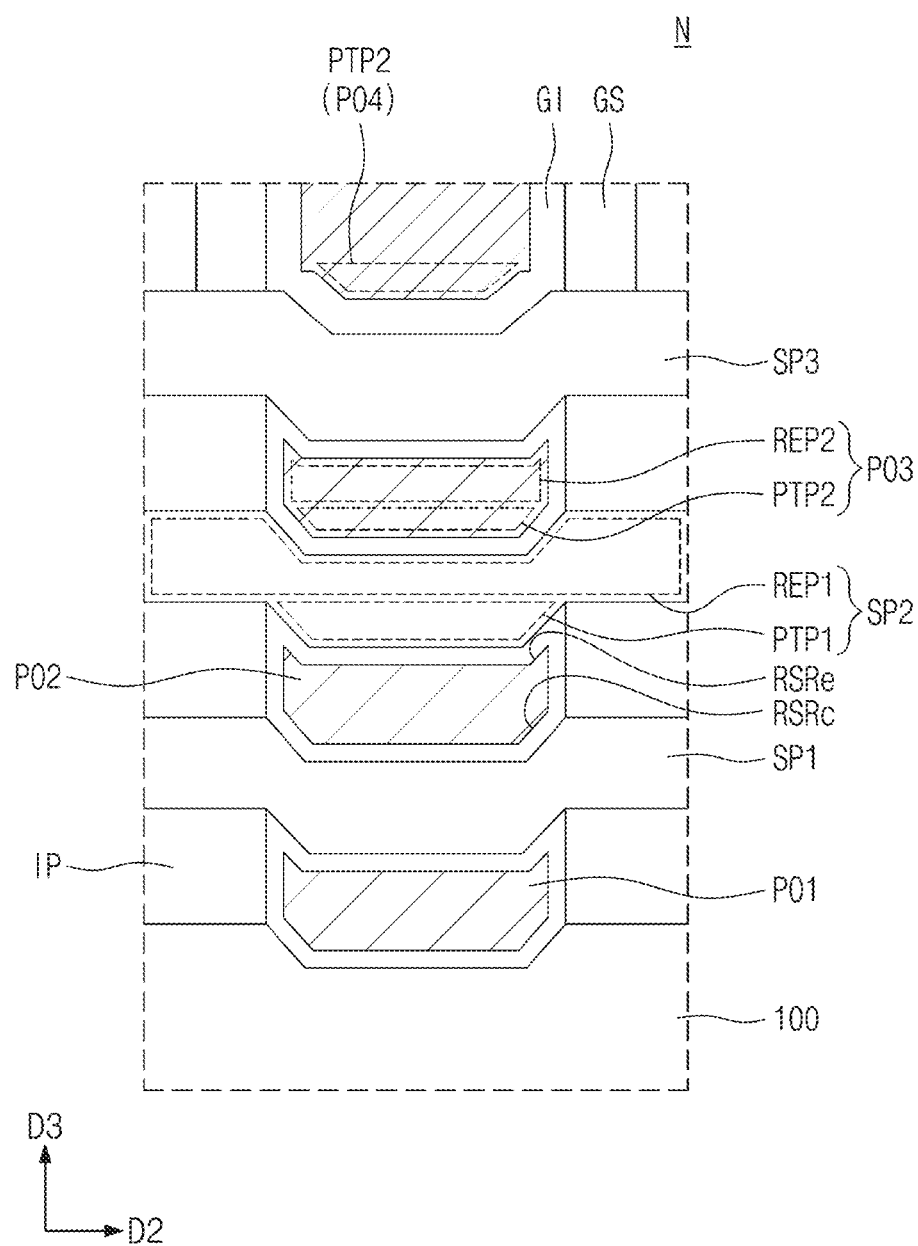
FIG. 16B illustrates an enlarged cross-sectional view showing section N of FIG. 15B.

FIG. 14 illustrates a plan view showing a semiconductor device according to some embodiments of inventive concepts. FIGS. 15A and 15B illustrate cross-sectional views respectively taken along lines A-A' and B-B' of FIG. 14. FIG. 16A illustrates an enlarged cross-sectional view showing section M of FIG. 15A. FIG. 16B illustrates an enlarged cross-sectional view showing section N of FIG. 15B.

Referring to FIGS. 14, 15A, and 15B, a substrate 100 may include a first active region PR and a second active region NR. In an embodiment of inventive concepts, the first active region PR may be a PMOSFET region, and the second active region NR may be an NMOSFET region. The substrate 100 may be a compound semiconductor substrate or a semiconductor substrate including silicon, germanium, or silicon-germanium. For example, the substrate 100 may be a silicon substrate.

The first active region PR and the second active region NR may be defined on the substrate 100. First active patterns AP1 and second active patterns AP2 may be respectively provided on the first active region PR and the second active region NR.

A first channel pattern CH1 may be provided on the first active pattern AP1. The first channel pattern CH1 may include a first semiconductor pattern SP1, a second semiconductor pattern SP2, and a third semiconductor pattern SP3 that are vertically stacked. The first, second, and third semiconductor patterns SP1, SP2, and SP3 may be spaced apart from each other in a third direction D3. The first, second, and third semiconductor patterns SP1, SP2, and SP3 may vertically overlap each other. A second channel pattern CH2 may be provided on the second active pattern AP2. The second channel pattern CH2 may include a first semiconductor pattern SP1, a second semiconductor pattern SP2, and a third semiconductor pattern SP3 that are vertically stacked. The first and second channel patterns CH1 and CH2 may include at least one selected from silicon (Si), germanium (Ge), and silicon-germanium (SiGe).

The first active patterns AP1 may have first source/drain patterns SD1 on upper portions thereof. The first source/drain patterns SD1 may be impurity regions having a first conductivity type (e.g., p-type). The first channel pattern CH1 may be interposed between a pair of first source/drain patterns SD1.

The first source/drain pattern SD1 may include a first semiconductor layer SEL1 and a second semiconductor layer SEL2. The first semiconductor layer SEL1 may have a thickness that decreases in a direction toward an upper portion thereof from a lower portion thereof. The first semiconductor layer SEL1 may have a U shape. The second semiconductor layer SEL2 may be provided on the first semiconductor layer SEL1. The second semiconductor layer SEL2 may have a volume greater than that of the first semiconductor layer SELL Each of the first and second semiconductor layers SEL1 and SEL2 may include silicon-germanium (SiGe). For example, the first semiconductor layer SEL1 may contain germanium (Ge) whose concentration is relatively low. In an embodiment of inventive concepts, the first semiconductor layer SEL1 may include only silicon (Si) and may not include germanium (Ge). The first semiconductor layer SEL1 may have a germanium concentration of about 0 at % to about 10 at %.

The second semiconductor layer SEL2 may contain germanium (Ge) whose concentration is relatively high. For example, the second semiconductor layer SEL2 may have a germanium (Ge) concentration of about 30 at % to about 55 at %. The germanium concentration of the second semiconductor layer SEL2 may gradually increase in the third direction D3.

The second active patterns AP2 may have second source/drain patterns SD2 on upper portions thereof. The second source/drain patterns SD2 may be impurity regions having a second conductivity type (e.g., n-type). The second channel pattern CH2 may be interposed between a pair of second source/drain patterns SD2.

A plurality of gate electrodes GE may be provided to extend in a first direction D1, while running across the first and second channel patterns CH1 and CH2. The gate electrode GE may vertically overlap the first and second channel patterns CH1 and CH2. A pair of gate spacers GS may be disposed on opposite sidewalls of the gate electrode GE. A gate capping pattern GP may be provided on the gate electrode GE.

The gate electrode GE may surround each of the first and second channel patterns CH1 and CH2. For example, the gate electrode GE may surround a top surface, a bottom surface, and opposite sidewalls of each of the first, second, and third semiconductor patterns SP1, SP2, and SP3. A transistor according to the present embodiment may be a three-dimensional field effect transistor (e.g., MBCFET) in which the gate electrode GE three-dimensionally surrounds the first and second channel patterns CH1 and CH2.

A gate dielectric layer GI may be provided between the gate electrode GE and each of the first and second channel patterns CH1 and CH2. The gate dielectric layer GI may surround each of the first and second channel patterns CH1 and CH2.

On the second active region NR, an inner spacer IP may be interposed between the gate dielectric layer GI and the second source/drain pattern SD2. The gate dielectric layer GI and the inner spacer IP may separate the gate electrode GE from the second source/drain pattern SD2. In contrast, the inner spacer IP may be omitted from the first active region PR.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly connect to the first and second source/drain patterns SD1 and SD2. A gate contact GC may be provided to penetrate the second interlayer dielectric layer 120 and the gate capping pattern GP and to connect to the gate electrode GE.

The active contact AC may have an upper portion adjacent to the gate contact GC, and an upper dielectric pattern UIP may fill the upper portion of the gate contact GC. Therefore, it may be possible to limit and/or prevent a short circuit caused by contact between the gate contact GC and its adjacent active contact AC.

A logic cell LC may have opposite sides that face each other in a second direction D2, and a pair of separation structures DB may be provided on the opposite sides of the logic cell LC. The separation structure DB may extend in the first direction D1 parallel to the gate electrodes GE. The separation structure DB may penetrate the first and second interlayer dielectric layers 110 and 120 to extend into the first and second active patterns AP1 and AP2. The separation structure DB may penetrate the upper portion of each of the first and second active patterns AP1 and AP2. The separation structure DB may separate the first and second active regions PR and NR of the logic cell LC from an active region of an adjacent logic cell.

A silicide pattern SC may be interposed between the active contact AC and the first source/drain pattern SD1 and between the active contact AC and the second source/drain pattern SD2.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A third interlayer dielectric layer 130 may be provided on the second interlayer dielectric layer 120. A fourth interlayer dielectric layer 140 may be provided on a third interlayer dielectric layer 130. A first metal layer M1 may be provided in the third interlayer dielectric layer 130. The first metal layer M1 may include first lower lines M1_R, second lower lines M1_I, and lower vias VI1. The lower vias VI1 may be provided below the first and second lower lines M1_R and M1_I. Each of the first lower lines M1_R may extend in the second direction D2, while running across the logic cell LC. Each of the first lower lines M1_R may be a power line. For example, the first lower line M1_R may be supplied with a drain voltage VDD or a source voltage VSS. The second lower lines M1_I may be disposed along the first direction D1 between the first lower line M1_R to which the drain voltage VDD is applied and the first lower line M1_R to which the source voltage VSS is applied. Each of the second lower lines M1_I may have a linear or bar shape that extends in the second direction D2.

The lower vias VI1 may be provided below the first and second lower lines M1_R and M1_I of the first metal layer M1. The lower vias VI1 may be correspondingly interposed between the active contacts AC and the first and second lower lines M1_R and M1_I. The lower vias VI1 may be correspondingly interposed between the gate contacts GC and the second lower lines M1_I.

A second metal layer M2 may be provided in the fourth interlayer dielectric layer 140. The second metal layer M2 may include upper lines M2_I. Each of the upper lines M2_I may have a linear or bar shape that extends in the first direction D1. For example, the upper lines M2_I may parallel extend in the first direction D1. When viewed in plan, the upper lines M2_I may be parallel to the gate electrodes GE.

The second metal layer M2 may further include upper vias VI2. The upper vias VI2 may be provided below the upper lines M2_I. The upper vias VI2 may be correspondingly interposed between the upper lines M2_I and the lower lines M1_R and M1_I.

The lower lines M1_R and M1_I of the first metal layer M1 may include a conductive material the same as or different from that of the upper lines M2_I of the second metal layer M2. For example, the upper lines M2_I and the lower lines M1_R and M1_I may include at least one metallic material selected from aluminum, copper, tungsten, molybdenum, and cobalt.

In an embodiment of inventive concepts, although not shown, stacked metal layers (e.g., M3, M4, M5, etc.) may be additionally provided on the fourth interlayer dielectric layer 140. Each of the stacked metal layers may include routing lines.

The gate electrodes GE and the first to third semiconductor patterns SP1, SP2, and SP3 will be further discussed in detail with reference to FIGS. 16A and 16B.

Referring to FIGS. 16A and 16B, the gate electrode GE may include a first portion PO1 between the substrate 100 and the first semiconductor pattern SP1, a second portion PO2 between the first and second semiconductor patterns SP1 and SP2, a third portion PO3 between the second and third semiconductor patterns SP2 and SP3, and a fourth portion PO4 on a top surface of the third semiconductor pattern SP3.

As discussed with reference to FIG. 3, each of the first to third semiconductor patterns SP1 to SP3 may include a first recess part REP1 that has a first recess region RSRc on a top surface of the first recess part REP1, and may also include a first protrusion part PTP1 that protrudes from a bottom surface of the first recess part REP1.

As discussed with reference to FIG. 3, each of the first to third portions PO1 to PO3 may include a second recess part REP2 that has a second recess region RSRe on a top surface of the second recess part REP2, and may also include a second protrusion part PTP2 that protrudes from a bottom surface of the second recess part REP2. Likewise, the fourth upper portion UE4 discussed with reference to FIG. 3, the fourth portion PO4 may include the second protrusion part PTP2, and may not include the second recess region RSRe.

According to inventive concepts, first to third lower semiconductor patterns and first to third upper semiconductor patterns each may have a downwardly bent shape. Therefore, even when a semiconductor device has a reduced size, it may be possible to form the first to third lower semiconductor patterns and the first to third upper semiconductor patterns each of which has a relatively large length. As a result, the sub-threshold swing caused by short channel effects may be reduced to increase electrical properties of the semiconductor device.

In addition, there may be an increased distance between a gate electrode and lower and upper source/drain patterns, and thus there may be a reduction in electric field between the gate electrode and the lower and upper source/drain patterns. Accordingly, there may be a reduction in gate induced drain leakage (GIDL) due to band-to-band tunneling. In conclusion, the semiconductor device may increase in electrical properties.

Although some embodiments of inventive concepts have been described in connection with the embodiments of inventive concepts illustrated in the accompanying drawings, it will be understood by one of ordinary skill in the art that variations in form and detail may be made therein without departing from the spirit and scope of inventive concepts. The above disclosed embodiments should thus be considered illustrative and not restrictive.

What is claimed is:

1. A semiconductor device, comprising:
an active pattern on a substrate;
a lower channel pattern on the active pattern, the lower channel pattern including a first lower semiconductor pattern and a second lower semiconductor pattern that are stacked on each other and spaced apart from each other;
an upper channel pattern on the lower channel pattern, the upper channel pattern including a first upper semiconductor pattern and a second upper semiconductor pattern that are stacked on each other and spaced apart from each other;
a pair of lower source/drain patterns on opposite sides of the lower channel pattern;
a pair of upper source/drain patterns on opposite sides of the upper channel pattern; and
a gate electrode surrounding the lower channel pattern and the upper channel pattern while extending across the active pattern, the gate electrode including a first upper portion and a first lower portion, the first upper portion being between the first upper semiconductor pattern and the second upper semiconductor pattern, and the first lower portion being between the first lower semiconductor pattern and the second lower semiconductor pattern, wherein
the first upper semiconductor pattern, the second upper semiconductor pattern, the first lower semiconductor pattern, and the second lower semiconductor pattern each include a first recess part and a first protrusion part,
the first recess part has a first recess region on a top surface of the first recess part, and
the first protrusion part protrudes from a bottom surface of the first recess part.

2. The semiconductor device of claim 1, wherein first upper portion of the gate electrode and the first lower portion of the gate electrode each include:
a second recess part having a second recess region on a top surface of the second recess part; and
a second protrusion part protruding from a bottom surface of the second recess part.

3. The semiconductor device of claim 2, wherein
the second protrusion part of the first upper portion of the gate electrode protrudes toward the first recess region of the first upper semiconductor pattern, and the second protrusion part of the first lower portion of the gate electrode protrudes toward the first recess region of the first lower semiconductor pattern.

4. The semiconductor device of claim 2, wherein
the first protrusion part of the second upper semiconductor pattern protrudes toward the second recess region of the first upper portion, and
the first protrusion part of the second lower semiconductor pattern protrudes toward the second recess region of the first lower portion.

5. The semiconductor device of claim 1, wherein a maximum width of the first recess part is greater than a maximum width of the first protrusion part.

6. The semiconductor device of claim 1, wherein
the gate electrode further includes a second lower portion below a bottom surface of the first lower semiconductor pattern, and
the second lower portion has a flat bottom surface.

7. The semiconductor device of claim 1, further comprising:
an upper inner spacer on a sidewall of the first upper portion of the gate electrode; and
a lower inner spacer on a sidewall of the first lower portion of the gate electrode.

8. The semiconductor device of claim 7, wherein
the upper inner spacer is in contact with a sidewall of the first protrusion part of the second upper semiconductor pattern, and
the lower inner spacer is in contact with a sidewall of the first protrusion part of the second lower semiconductor pattern.

9. The semiconductor device of claim 1, wherein a maximum width of the first recess region of the first upper semiconductor pattern is greater than a maximum width of the first recess region of the second upper semiconductor pattern.

10. The semiconductor device of claim 1, wherein a bottom surface of the first protrusion part of each of the first upper semiconductor pattern and the second upper semiconductor pattern has a profile that is convex toward the substrate.

11. A semiconductor device, comprising:
an active pattern extending in a first direction on a substrate;
a pair of lower source/drain patterns on the active pattern;
a pair of upper source/drain patterns on the pair of lower source/drain patterns;
a lower channel pattern that connects the pair of lower source/drain pattern to each other, the lower channel pattern including a first lower semiconductor pattern and a second lower semiconductor pattern that are sequentially stacked on each other and spaced apart from each other;
an upper channel pattern that connects the pair of upper source/drain pattern to each other, the upper channel pattern including a first upper semiconductor pattern and a second upper semiconductor pattern that are sequentially stacked on each other and spaced apart from each other; and
a gate electrode surrounding the lower channel pattern and the upper channel pattern, the gate electrode extending in a second direction that intersects the first direction,
wherein the gate electrode includes a first upper portion between the first upper semiconductor pattern and the second upper semiconductor pattern,
wherein the first upper portion includes a first recess part and a first protrusion part, the first recess part has a first recess region on a top surface of the first recess part, and the first protrusion part protrudes from the first recess part toward the first upper semiconductor pattern.

12. The semiconductor device of claim 11, wherein the first upper semiconductor pattern, the second upper semiconductor pattern, the first lower semiconductor pattern, and the second lower semiconductor pattern each include:
a second recess part having a second recess region on a top surface of the second recess part; and
a second protrusion part protruding from a bottom surface of the second recess part.

13. The semiconductor device of claim 12, wherein a level of a lowermost end of the first protrusion part in the first upper portion of the gate electrode is lower than a level of an uppermost surface of the second recess part in the first upper semiconductor pattern.

14. The semiconductor device of claim 12, wherein the first protrusion part of the first upper portion of the gate electrode protrudes toward the second recess region of the first upper semiconductor pattern.

15. The semiconductor device of claim 11, wherein a width of the first protrusion part decreases in a direction toward the substrate.

16. A semiconductor device, comprising:
an active pattern extending in a first direction on a substrate;
a lower channel pattern on the active pattern, the lower channel pattern including a first lower semiconductor pattern, a second lower semiconductor pattern, and a third lower semiconductor pattern that are sequentially stacked on each other and spaced apart from each other;
an upper channel pattern on the lower channel pattern, the upper channel pattern including a first upper semiconductor pattern, a second upper semiconductor pattern, and a third upper semiconductor pattern that are sequentially stacked on each other and spaced apart from each other;
a pair of lower source/drain patterns on opposite sides of the lower channel pattern, the pair of lower source/drain pattern having bottom surfaces at a level lower than a level of an uppermost surface of the active pattern;
a first interlayer dielectric layer on the pair of lower source/drain patterns;
a pair of upper source/drain patterns on the first interlayer dielectric layer and on opposite sides of the upper channel pattern;
a second interlayer dielectric layer on the pair of upper source/drain patterns;
a gate electrode extending in second direction across the active pattern, the second direction intersecting the first direction, the gate electrode surrounding the lower channel pattern and the upper channel pattern;
a gate spacer on a sidewall of the gate electrode; and
a gate capping pattern on a top surface of the gate electrode,
wherein the gate electrode includes
a first lower portion on a bottom surface of the first lower semiconductor pattern,
a second lower portion between the first lower semiconductor pattern and the second lower semiconductor pattern, a third lower portion between the second lower semiconductor pattern and the third lower semiconductor pattern,
a first upper portion between the first lower semiconductor pattern and the first upper semiconductor pattern,
a second upper portion between the first upper semiconductor pattern and the second upper semiconductor pattern,
a third upper portion between the second upper semiconductor pattern and the third upper semiconductor pattern, and
a fourth upper portion on a top surface of the third upper semiconductor pattern,
wherein the first upper semiconductor pattern, the second upper semiconductor pattern, the third upper semiconductor pattern, the first lower semiconductor pattern, the second lower semiconductor pattern, and the third lower semiconductor pattern each include a first recess part and a first protrusion part,
the first recess part has a first recess region on a top surface of the first recess part, and
the first protrusion part protrudes from a bottom surface of the first recess part.

17. The semiconductor device of claim 16, wherein a thickness of the first upper portion of the gate electrode is greater than a thickness of the second upper portion of the gate electrode.

18. The semiconductor device of claim 16, wherein each of the second lower portion, the third lower portion, the first upper portion, the second upper portion, and the third upper portion includes:
 a second recess part has a second recess region on a top surface of the second recess part; and
 a second protrusion part protrudes from a bottom surface of the second recess part.

19. The semiconductor device of claim 16, wherein
the first recess part of the first lower semiconductor pattern is in contact with the pair of lower source/drain patterns, and
the first recess part of the first upper semiconductor pattern is in contact with the pair of upper source/drain patterns.

20. The semiconductor device of claim 16, wherein
the lower source/drain patterns have a n-type conductivity type, and
the upper source/drain patterns have a p-type conductivity type.

* * * * *